(12) United States Patent
Yamamoto et al.

(10) Patent No.: US 6,987,035 B2
(45) Date of Patent: Jan. 17, 2006

(54) METHOD AND APPARATUS FOR FORMING CRYSTALLIZED SEMICONDUCTOR LAYER, AND METHOD FOR MANUFACTURING SEMICONDUCTOR APPARATUS

(75) Inventors: Yoshitaka Yamamoto, Yokohama (JP); Mikihiko Nishitani, Yokohama (JP); Masato Hiramatsu, Yokohama (JP); Masayuki Jyumonji, Yokohama (JP); Yoshinobu Kimura, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 0 days.

(21) Appl. No.: 10/857,941

(22) Filed: Jun. 2, 2004

(65) Prior Publication Data

US 2005/0014315 A1    Jan. 20, 2005

(30) Foreign Application Priority Data

Jun. 3, 2003    (JP)    ............................. 2003-158136

(51) Int. Cl.
*H01L 21/00* (2006.01)
(52) U.S. Cl. ...................................... 438/154; 438/166
(58) Field of Classification Search ...................... None
See application file for complete search history.

(56) References Cited

U.S. PATENT DOCUMENTS 5,824,574 A * 10/1998 Yamazaki et al. .......... 438/166

6,316,338 B1 * 11/2001 Jung ........................ 438/487
2003/0071312 A1    4/2003 Oana et al.

FOREIGN PATENT DOCUMENTS

EP    1 047 119 A2    10/2000
JP    2001-127301    5/2001

OTHER PUBLICATIONS

Mitsuru Nakata, et al., "A New Nucleation-Site-Control Excimer-Laser-Crystallization Method", Jpn. J. Appl. Phys., vol., 40 (2001), Part 1, No. 5A, May 2001, pp. 3049-3054.
Chang-Ho Oh, et al., "Preparation of Position-Controlled Crystal-Silicon Island Arrays by Means of Excimer-Laser Annealing", Jpn. J. Appl. Phys., vol., 37, (1998), Part 1, No. 10, Oct. 1998, pp. 5474-5479.

* cited by examiner

*Primary Examiner*—Chandra Chaudhari
(74) *Attorney, Agent, or Firm*—Oblon, Spivak, McClelland, Maier & Neustadt, P.C.

(57) ABSTRACT

A method for forming a crystallized semiconductor layer includes preparing a non-single-crystal semiconductor layer in which at least one crystal seed is formed, and irradiating with an energy ray the non-single-crystal semiconductor layer having the crystal seed formed therein to allow a crystal to laterally grow from the crystal seed in the non-single-crystal semiconductor layer, irradiation of the energy ray is carried out by positioning to at least a part of the crystal seed an area having a minimum intensity value of the energy ray, the energy ray having a confirmation that an area having a maximum intensity value of the energy ray is continuously reduced to the area having the minimum intensity value in an irradiated surface.

23 Claims, 12 Drawing Sheets

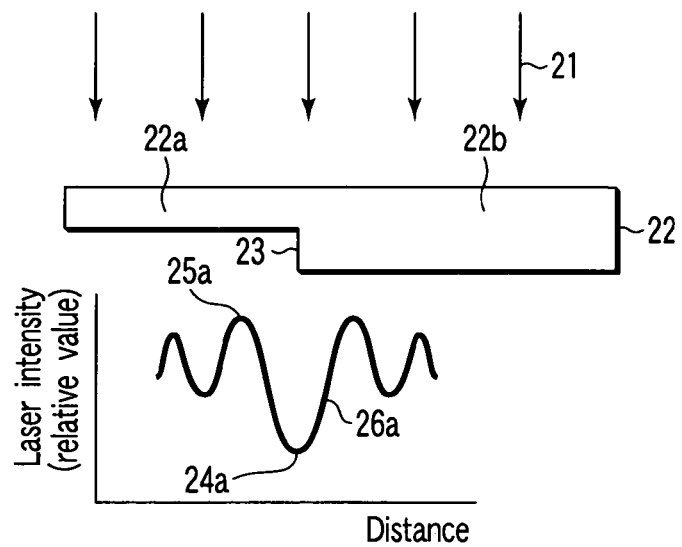
FIG. 3A
FIG. 3B
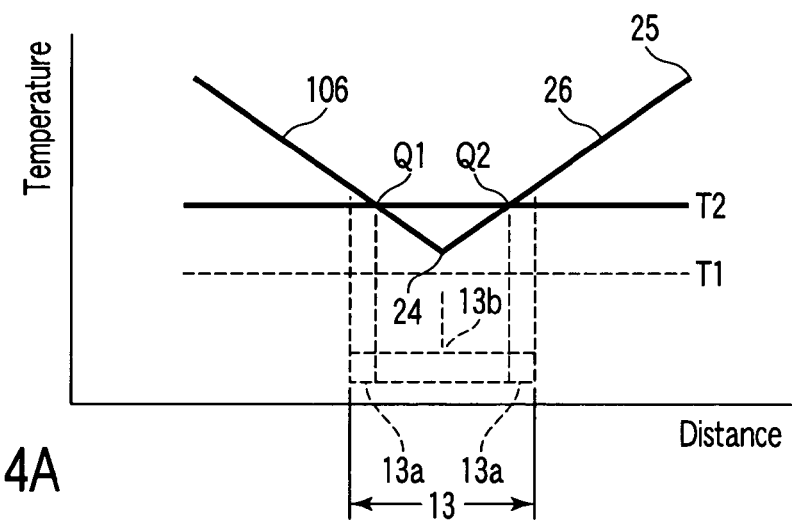
FIG. 4A
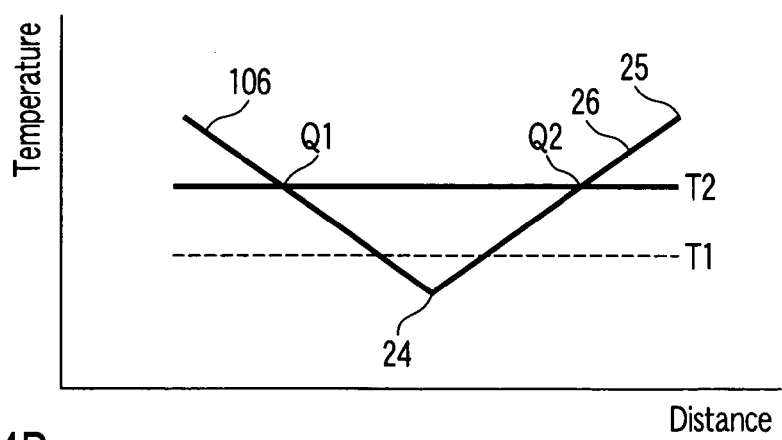
FIG. 4B

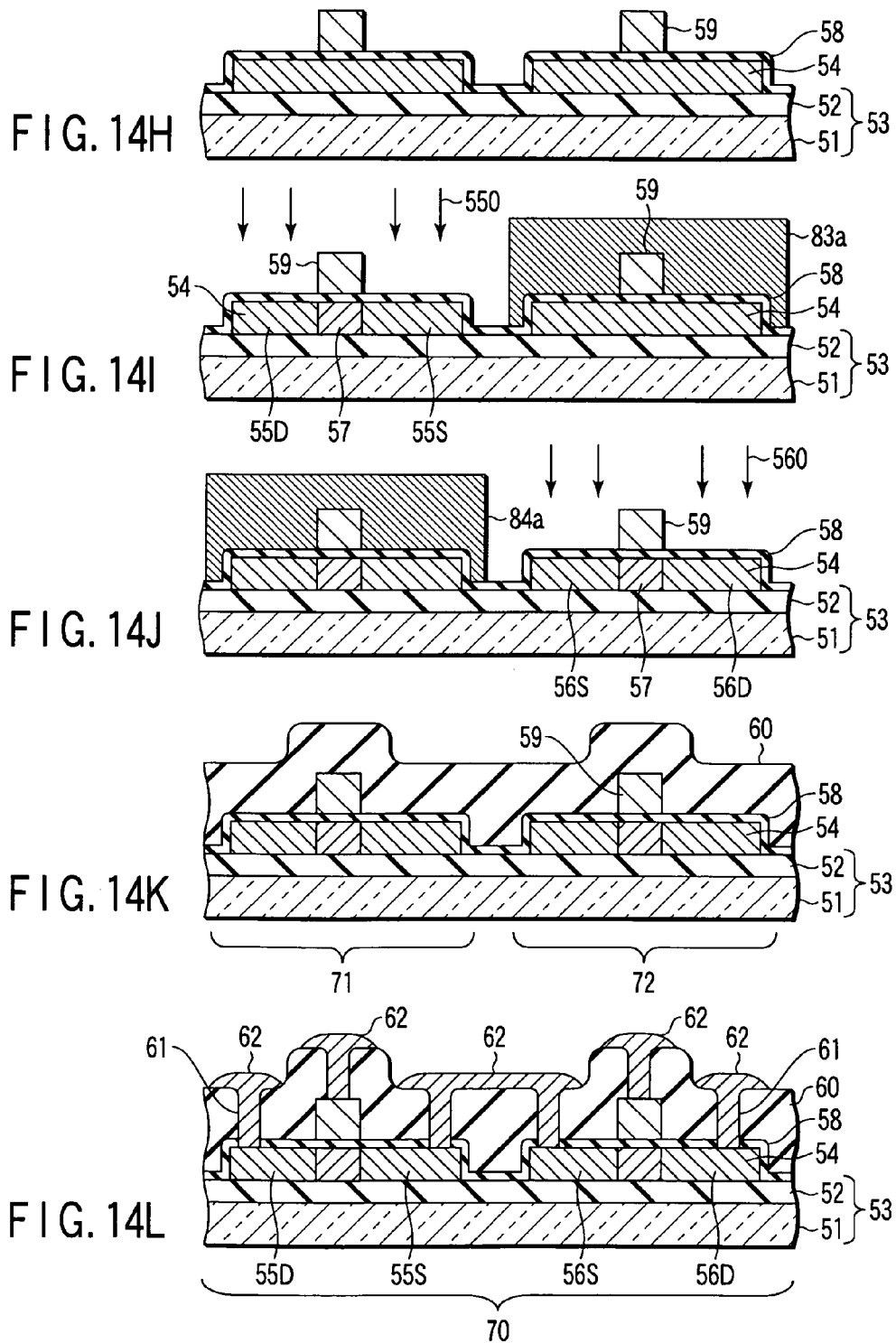

METHOD AND APPARATUS FOR FORMING CRYSTALLIZED SEMICONDUCTOR LAYER, AND METHOD FOR MANUFACTURING SEMICONDUCTOR APPARATUS

CROSS-REFERENCE TO RELATED APPLICATIONS

This application is based upon and claims the benefit of priority from prior Japanese Patent Application No. 2003-158136, filed Jun. 3, 2003, the entire contents of which are incorporated herein by reference.

BACKGROUND OF THE INVENTION

1. Field of the Invention

The present invention relates to a method for forming a crystallized semiconductor layer which is crystallized from a non-single-crystal semiconductor layer by using laser beams, a method for manufacturing a semiconductor apparatus, an apparatus for forming a crystallized semiconductor layer, and a method for manufacturing a display apparatus.

2. Description of the Related Art

As well known, a thin film semiconductor device such as a thin film transistor (TFT) has a substrate in which a semiconductor layer consisting of a semiconductor substance such as silicon is formed on a base substance consisting of an insulating material such as quartz glass. In the semiconductor layer of this substrate, a channel area is defined between a source area and a drain area formed to be separated from each other. A gate electrode is provided on the channel area through an insulating film.

The semiconductor layer is generally formed of amorphous silicon or polycrystalline silicon. In a TFT using a substrate having a layer of amorphous silicon, a mobility of electrons or holes is very low. For example, since the electron mobility is usually (not more than approximately 1 $cm^2/V \cdot sec$), an operating speed of the TFT is slow. As a result, such a TFT in hardly be used in an apparatus which requires a high-speed operation.

A semiconductor layer in which a channel area is formed of a polycrystalline silicon film is recently in heavy usage for the purpose of increasing the mobility. This polycrystalline silicon film is composed of many crystal grains having a very small particle size. Therefore, when it is operated as a semiconductor circuit apparatus, crystal grain boundaries become an obstacle for a flow of electrons, and there is a limit in improvement of the mobility.

Therefore, there has been examined acquisition of a thin film semiconductor device with the mobility being increased by reducing or eliminating the crystal grain boundary in the channel area by increasing a size of the crystal grain of the polycrystal silicon film, and further reducing or eliminating an obstacle for an electron flow. For example, there has been attempted formation of a thin film TFT which realizes the mobility of approximately 100 $cm^2/V \cdot sec$ by heating a polycrystal silicon film in a high-temperature furnace in order to increase a particle size and thereby growing crystal grains having a particle size of approximately 1 $\mu m$. In order to crystallize the amorphous silicon to have a large particle size and form a TFT in this manner, a heat treatment at a high temperature which is not less than 600° C. is required. Therefore, a quartz glass plate which can withstand a high temperature must be used as an insulating substrate, and an inexpensive glass plate (e.g., a soda glass plate) cannot be used. Therefore, such a TFT becomes expensive and has a drawback that it is hard to be used in display apparatus or the like for a large-screen TV receiver which uses many TFTs.

Thus, there has been developed a method for crystallizing non-single-crystal silicon by a laser annealing process without using a high-temperature heat treatment step. For example, there have been proposed some attempts in which silicon of an amorphous silicon film or a polycrystal silicon film is crystallized or re-crystallized by irradiating the film with an excimer laser beam in order to obtain a polycrystal silicon layer composed of crystal grains with a large particle size, and they have been put into practical use. According to such methods, crystal grains can be increased in size even if an inexpensive glass plate is used as a substrate.

However, even in a crystallization method using an excimer laser beam or the like, a particle size of obtained crystal grains is approximately 1 $\mu m$ at the maximum level, and the particle size is uneven (e.g., Jpn. Pat. Appln. KOKAI Publication No. 2001-127301). This cited reference discloses a series of operations that a zonal amorphous silicon film is polycrystallized by a fusion re-crystallization method, an amorphous silicon film is further deposited thereon and this is crystallized by using a solid phase growth method. This prior art method is a technique which first forms a crystal of a zonal polycrystal film composed of many small crystal grains, grows a crystal in a horizontal direction by using this as a crystal seed in order to obtain a polycrystal film having a crystal with a large grain size.

Even this proposed method is not satisfactory. That is because an acquired maximum crystal grain size is approximately 1000 nm (i.e., 1 $\mu m$), the particle size is uneven and it is suggested that irregularities in mobility become large (see FIGS. 2 to 5 in the above-described cited reference).

Furthermore, as a problem which has passed unnoticed in the conventional polycrystal semiconductor device, there is a problem in a crystal grain arrangement conformation in a layer. That is, in the conventional polycrystal semiconductor layer, the crystal grain arrangement conformation in a two-dimensional direction is completely random, and aligning the crystal grains has not been attempted. The randomness of the crystal grain arrangement and the uneven particle size produce irregularities in characteristics of thin film transistors, and bring a serious drawback to performances of an apparatus to be used for the following reasons.

In an arrangement of a transistor circuit in a thin film semiconductor device, many unit circuits must be aligned regularly and systematically, e.g., in a geometrical arrangement conformation. If a crystal particle size or a crystal arrangement of a polycrystal layer which is a base of formation of circuits is uneven, unit circuits are formed over crystal grains with various particle sizes or arrangements. This brings a result that the mobility or the electron passage conformation differs depending on each unit circuit, and adversely affects performances of the thin film semiconductor apparatus. For example, if there are irregularities in characteristics of each unit circuit, the entire apparatus must be designed with low-level characteristics as a basis.

BRIEF SUMMARY OF THE INVENTION

It is an object of the present invention to provide a method for forming a crystallized semiconductor layer in which crystallized grain formation positions are aligned and electron or hole mobility characteristics are also unified, a method for manufacturing a semiconductor apparatus, an apparatus for forming a crystallized semiconductor layer and a method for manufacturing a display apparatus. That is, in a thin film semiconductor apparatus in which a unit electrical circuit is arranged in accordance with each crystallized grain having a large particle size, irregularities in mobility of electrons or holes are improved.

The inventors of the present invention have developed a technique by which positions where crystallized crystal grains are generated are aligned in good order by irradiating a non-single-crystal semiconductor layer deposited on a substrate of glass or the like with a regular energy line or ray or a laser beam having a predetermined energy ray irradiation intensity distribution. That is, in this technique, at least one crystal seed is formed or regularly arranged in a non-single-crystal semiconductor layer in advance, and an energy ray is applied in such an irradiation intensity distribution conformation as that at least a part of this crystal seed is not melted but the portion of the non-single-crystal semiconductor film adjacent to the crystal seed is melted, thereby aligning the crystal grain generation positions in good order. Here, "application of an energy ray in such an irradiation intensity distribution conformation as that at least a part of this crystal seed is not melted but the portion of the non-single-crystal semiconductor film adjacent to the crystal seed is melted" means that an area of the energy ray having a minimum value of an irradiation intensity, which continuously varies from an area of the energy ray having a maximum value of the same to the area having the minimum value, is positioned to the crystal seed, and the energy ray or rays are applied. The present inventors have found that using a crystal phase initial film having a so-called crystal orientation plane of (110) or (111) as the crystal seed can obtain matching of crystal orientations of generated crystal grains, and reached the present invention.

Providing a crystal seed to a semiconductor layer before applying the energy ray to the non-crystal semiconductor layer can hasten start of crystallization of the semiconductor layer, prolong a crystallization advancing time, and thereby have a good impact on an increase in particle size of generated crystal grains or arrangement of a crystal grain boundary in order. In order to hasten start of the crystal growth, there are known application of an energy ray such as a laser beam and a reduction in a period of a supercooling state (i.e., a state in which semiconductor is not solidified even if it enters a state which is not more than its melting point) which is generated by heat conduction to a glass substrate involved by this application. As a result, the crystallization advancing time must be prolonged. As means for reducing the period of the supercooling state, there has been widely carried out provision of a head conduction control film such as made of silicon oxide ($SiO_2$) between a glass substrate and a semiconductor layer in order to lower heat conduction to the glass substrate. In order to sufficiently lower heat conduction to the glass substrate by using such a heat conduction control film, the heat conduction control film must have the porosity. Although providing the porous film is effective for reducing heat conduction, the strength of the manufactured thin film semiconductor device may be possibly lowered due to the brittleness derived from the porosity, and there is a problem that the quality of the semiconductor film formed on the porous film is deteriorated.

The present inventors have discovered that arranging the crystal seed or seeds in the semiconductor layer in advance can hasten start of a crystal growth on an early stage before the semiconductor enters the excessive supercooling state, even if the porous heat conduction control film or the like is not used. Thus, there may be obtained an increase in particle size of crystal grains or arrangement of the crystal grain boundary in order.

Therefore, a method for forming a crystallized semiconductor layer according to a first aspect of the present invention, comprises a method for forming a crystallized semiconductor layer comprising: preparing a non-single-crystal semiconductor layer in which at least one crystal seed is formed; and irradiating with an energy ray the non-single-crystal semiconductor layer having the crystal seed formed therein to allow a crystal to laterally grow from the crystal seed in the non-single-crystal semiconductor layer, wherein irradiation of the energy ray is carried out by positioning to at least a part of the crystal seed an area having a minimum intensity value of the energy ray, the energy ray having a confirmation that an area having a maximum intensity value of the energy ray is continuously reduced to the area having the minimum intensity value in an irradiated surface.

In particular, it was found that using a crystal seed or seeds having a so-called crystal plane orientation of (110) or (111) as a crystal seed, crystal plane orientations of respective generated crystal grains are matched to have a plane orientation of (110) or (111), which greatly contributes to an improvement in performances of a manufactured thin film semiconductor device in addition to the effect of hastening start of crystallization. That is, even if a semiconductor layer in which single crystal grains with a large particle size are arranged in good order is obtained and a thin film semiconductor device in which a unit electrical circuit is arranged in accordance with a crystal grain is acquired, irregularities in crystal plane orientations of respective generated crystal grains cause the mobility of each unit electrical circuit to slightly differ, and an improvement in mobility of the entire apparatus may thereby possibly become insufficient. Further, when irregularities occur in opening values with which currents are caused to flow, performances of the entire circuits may be deteriorated.

However, when a crystal seed having a crystal orientation plane of (110) or (111) is used as a crystal seed which is arranged in the semiconductor layer in advance, growth directions of the crystal are two-dimensionally defined, and the crystal plane orientations of the generated crystal grains are defined to a plane orientation of (110) or (111). As a result, the mobility of the electrical circuit arranged in accordance with each crystal grain is unified, thereby obtaining a high-performance thin film semiconductor device in which the mobility is sufficiently improved.

BRIEF DESCRIPTION OF THE SEVERAL VIEWS OF THE DRAWING

FIGS. 3A and 3B are views illustrating an example of obtaining a laser beam intensity distribution used for crystallization explained in FIG. 1E, in which FIG. 3A shows a phase shifter and FIG. 3B shows a light intensity distribution;

FIGS. 4A and 4B are views illustrating a relationship between an irradiation position obtained by laser beams having a light intensity distribution depicted in FIG. 3B and a crystal seed;

FIGS. 14A to 14L are views illustrating steps for manufacturing the CMOS thin film transistor depicted in FIG. 13;

DETAILED DESCRIPTION OF THE INVENTION

Figure 1A:
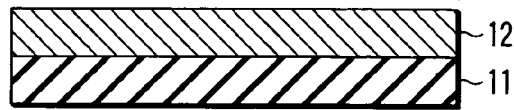
FIGS. 1A to 1E are views illustrating a method for manufacturing a semiconductor thin film or layer according to an embodiment of the present invention in a process order.

Embodiments according to the present invention will now be described with reference to the accompanying drawings. In respective figures, like reference numerals denote substantially the same or similar parts or members, and their detailed explanations will be eliminated.

In the present invention, as arrangement conformations of a crystal seed, there are roughly two types of conformations. An example of a first conformation will now be described with reference to FIGS. 1A to 1E.

Figure 1B:
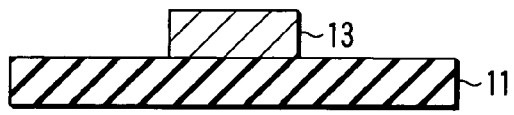

A non-single crystal semiconductor such as an amorphous silicon film 12 is formed on an insulative base substance 11 formed of a glass substrate or the like by a known film formation method, e.g., a CVD method (FIG. 1A). Thus, a base body is formed in order to form this amorphous silicon film 12 as a crystal seed, crystallization processing is applied by a known method, e.g., the method described in the section "background", and shaping processing is applied to the film in order to obtain a predetermined pattern by means such as photo-etching (FIG. 1B). As a result, many dot-shaped, island-shaped or linearly shaped crystal seed semiconductor layers or crystallized semiconductor layers 13 are regularly arranged on the insulative base substance 11. FIG. 1B shows one linear or filiform crystal seed semiconductor layer 13 as an example.

Figure 1C:
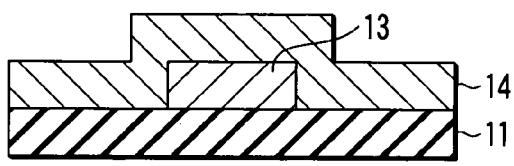
Figure 1D:
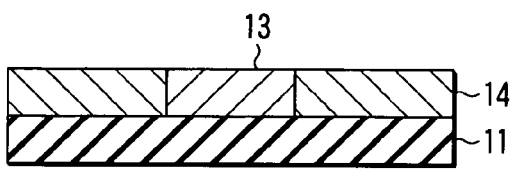

Then, a semiconductor layer 14 of a non-single-crystal semiconductor (e.g., an amorphous semiconductor or a mixture of an amorphous semiconductor and a microcrystal semiconductor) is formed by, e.g., the same method as that used to form the layer 12 to cover surfaces of the crystal seed semiconductor layer or crystal seed 13 and the insulative base substance 11 (FIG. 1C). Thereafter, the part of the semiconductor layer 14 positioned on the crystal seed semiconductor layer 13 is removed by means such as CMP (chemical mechanical polishing) to expose an upper surface of the crystal seed 13, and this upper surface and an upper surface of the semiconductor layer 14 are flattened to be on the same level (FIG. 1D). The exposed crystal seed semiconductor layer 13 is used as a crystal seed in a crystallization step, and a crystallized semiconductor layer 15 having large-size crystal grains is formed by later-described laser annealing.

In the step shown in FIG. 1A, when forming the crystalline semiconductor layer, the semiconductor layer can be formed in such a manner that its side surfaces have a fixed crystal plane orientation by the later-described technique. As a result, one or more crystal seed semiconductor layers 13 subjected to the shaping processing depicted in FIG. 1B have a desired fixed crystal plane orientation or crystal growth start plane.

A second crystal seed arrangement conformation will now be described with reference to FIGS. 2A and 2B.

Figure 2A:
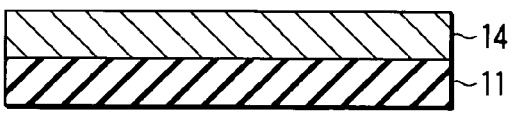
FIGS. 2A to 2C are views illustrating a method for manufacturing a semiconductor thin film or layer according to another embodiment in a process order.
Figure 2B:
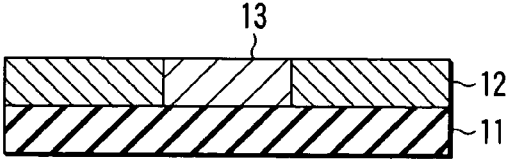
Figure 2C:
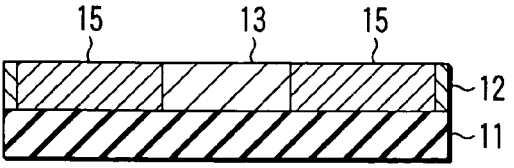

A semiconductor layer 12 which is an amorphous or polycrystal semiconductor or a microcrystal semiconductor or a mixture of these semiconductors is formed on an insulative base substance 11 (FIG. 2A). Thereafter, many dot-shaped, island-shaped or linearly shaped crystal seed semiconductor layers, areas or crystal seeds 13 are formed at predetermined positions of this semiconductor layer 12 by means such as laser beam irradiation (FIG. 2B). This figure shows only one crystal seed 13 for clarify. The resultant semiconductor layer 13 is used as a crystal seed, and a crystallized semiconductor layer 15 having large-size crystal grains is formed in the non-single-crystal semiconductor layer 12 by laser annealing like the first conformation (FIG. 2C). In case of this semiconductor layer 13, as will be described later, by forming the crystal seed semiconductor layer 13 of which side surfaces have a fixed crystal plane orientation, the crystallized semiconductor layer 15 having a fixed crystal plane orientation can be formed.

After obtaining the crystal seed semiconductor layer 13 in which one or more crystal seeds are arranged at predetermined positions on the insulative base substance 11 by one of the above-described conformations, the non-single-crystal semiconductor layers 12 and 14 can be subjected to crystal growth around the crystal seed by applying energy rays to this crystal seed semiconductor layer 13 and the non-single-crystal semiconductor layers 12 (FIG. 2B) and 14 (FIG. 1D) around the layer 13, thereby acquiring the crystallized semiconductor layer or area 15 having a large particle size.

An embodiment of a method for forming the crystallized semiconductor layer 15 will now be described. Energy rays which are required for crystallization with the crystal seed semiconductor layer 13 being used as a seed crystal are applied to the non-single-crystal semiconductor layers 12

(FIG. 2B) and 14 (FIG. 1D). This irradiation of the energy rays is application of an energy ray intensity distribution suitable for crystal growth with the crystal seed semiconductor layer 13 being used as a crystal nucleus when crystallizing the non-single-crystal semiconductor layers 12 and 14. This intensity distribution is a distribution having an area in which an energy ray application intensity has a maximum value and an area in which the intensity is continuously decreased and changed from this area to have a minimum value in an energy ray irradiation plane. The minimum intensity area of the energy ray having such an intensity distribution is positioned to a part or all of the crystal seed semiconductor layer 13, and the energy ray is applied in order to perform crystallization in a horizontal direction or a lateral direction (right-and-left direction in FIGS. 1E and 2C).

Specifically, there are applied the energy ray having the intensity distribution by which at least a part of the crystal seed semiconductor layer 13 is not melted but the non-single-crystal semiconductor layers 12 and 14 are melted.

By applying the above-described energy crystal grains having a large particle size grow in the horizontal direction with the crystal seed 13 as a nucleus. As a result, it is possible to efficiently manufacture a thin film semiconductor apparatus substrate having the crystallized semiconductor layer 15 in which crystal grains with a large particle size which have grown from the crystal seed are arranged.

A basic example of the method for manufacturing the thin film semiconductor device by using the thus obtained thin film semiconductor apparatus substrate will now be schematically described.

The semiconductor layer having crystal grains with a larger particle size formed at predetermined positions is formed into an island shape by using means such as photo-etching, and an island-shaped portion is formed at a position where the thin film semiconductor device is formed. Subsequently, a transistor, e.g., a gate insulating thin film (e.g., a silicon oxide film) is formed on this island-shaped portion, then a gate electrode, a source electrode and a drain electrode are formed, and thus a thin film transistor is formed.

An n-channel type MOS transistor and a p-channel type MOS transistor can be formed into a CMOS structure in this island-shaped portion. Further, in particular, forming two MOS transistors in the same crystal grain can reduce irregularities in characteristics of the mobility of electrons and holes of the MOS transistors due to unevenness of properties or the like of the crystal grains to a very small value. The thus formed thin film semiconductor device can have performances comparable to those of a single-crystal Si-MOS or an SOI device since there is no crystal grain boundary which runs across the source area/drain area direction (current flowing direction) in the channel area of the manufactured MOS transistor.

Although roughly two types of methods can be used as the crystal seed arrangement method in the present invention as described above, the first method by which the crystalline semiconductor layer is first formed on the insulative base substance 11 and it is then shaped in order to arrange the dot-shaped, island-shaped or linearly shaped crystal seeds are arranged in good order specifically have some modifications. That is, the amorphous silicon film 12 can be formed as an amorphous semiconductor layer can be first formed on the insulative base substance 11, entirely or partially crystallized and then subjected to shaping processing, thereby forming a crystal seed or seeds. Furthermore, a crystallized semiconductor layer which is crystallized from the beginning can be formed on the insulative base substance 11, and it can be subjected to shaping processing, thereby forming a crystal seed or seeds.

A preferred example of forming the amorphous semiconductor layer 12 will now be described hereinafter.

The amorphous silicon film 12 is deposited on the insulative base substance 11 with a deposition film thickness of 30 nm to 200 nm and, preferably, approximately 100 nm, and a crystal nucleus or nuclei having a crystal plane orientation of (111) are formed in this amorphous silicon film 12. After dehydrogenation processing, a laser beam application step is carried out. That is, a pulse laser having YAG second harmonic waves (532 mm), fourth harmonic waves (266 nm) or the like is used, and a laser beams is repeatedly applied while adjusting a laser energy in such a manner that the entire film is molten in a film thickness direction. As a result, a crystalline Si film having a crystal orientation plane (111) is oriented can be obtained on the insulative base substance surface. By sequentially performing such energy ray application processing on the entire surface of the substrate, a crystal seed having a crystal orientation plane of (111) can be formed.

Generally, when the crystalline Si thin film or layer is directly formed on the insulative base substance 11, a plane having a crystal orientation of (100), (110) or (111) grows in a predetermined direction. A temperature of the insulative base substance 11 such as made of glass, a raw material flux quantity, a coverage of hydrogen on the insulative base substance layer surface and others greatly concern a crystal orientation plane which is apt to appear among these crystal orientation planes. In case of the growth of a plane whose crystal plane orientation is, e.g., (110), two Si atoms coupled with each other on the base substance become a crystal growth nucleus, which is enabled by the one-dimensional crystal growth under the circumstance that a diffusion distance between the Si atoms is sufficiently long on the surface of the insulative base substance 11. When the surface of the insulative base substance 11 is covered with hydrogen and the raw material flux is supplied at such a temperature of the insulative base substance 11 (e.g., 30° C. to 400° C., preferably, 350° C.) as that hydrogen on the surface is not desorbed, the above-described condition can be realized.

As a method for forming a crystalline semiconductor layer, it is appropriate to use a plasma CVD method under, e.g., the following condition.

When forming a film by plasma-decomposing $SiH_4$ gas, a temperature of the insulative base substance 11 at the time of film formation is set to 350° C., the $SiH_4$ gas is diluted approximately tenfold by using $H_2$ gas, and plasma CVD is carried out. By this film formation method, a crystal seed having a crystal plane orientation (110) is formed on the insulative base substance 11, and using a film formed by plasma CVD employing a process gas in which $SiH_4$ gas and $SiF_4$ gas are mixed at the rate of 1:1 can form a crystalline Si film having a crystal plane orientation of (110). In any case, it is desirable to perform a heat treatment for the purpose of removing the hydrogen gas contained in the silicon thin film or layer after forming the silicon film.

After forming the crystalline Si thin film on the entire surface of the insulative base substance 11 as described above, it is shaped into a crystal seed (seeds) or a small crystal layer (layers) having a desired shape by the photo-etching process. In the photo-etching process, it is desirable to form an island-shaped mark which is used for laser beam application positioning which will be performed later. The above-described process is not restricted to the plasma CVD method, and an LPCVD method, a sputtering method or the like may be used.

A description will now be given as to an example of a concrete process of the second aspect of the crystal seed arrangement, i.e., the method for forming a crystal seed or seeds in a linear shape or a dot-like shape at a predetermined position of the layer by laser beam application or the like.

The amorphous silicon film 12 is formed on the insulative base substance 11 formed of glass, by the plasma CVD method. Since a large amount of hydrogen is included in the amorphous silicon film 12 formed by the plasma CVD method, it is desirable to remove hydrogen in the amorphous silicon (Si) film 12 by a heat treatment. As a method for forming the amorphous silicon film 12, it is not restricted to the plasma CVD method, and the amorphous silicon film 12 may be formed by the LPCVD method, the sputtering method or the like. In this case, the heat treatment for dehydration can be eliminated. Thereafter, the substrate is arranged on an optical stage, and crystallization in a linear shape or a dot-like shape is carried out at a coordinate position specified by a laser beam narrowed down to approximately 1 $\mu m \phi$. A laser device may be a pulse oscillation laser or a continuous oscillation laser, and a wavelength which is shorter than 550 nm is desirable. Moreover, a "mask" which cuts off unnecessary ports of the beam and shapes the beam into a predetermined shape may be inserted and arranged in place of narrowing down the laser.

A concrete process of the crystallization step according to the present invention will now be described with reference to FIGS. 3A and 3B.

The energy ray such as a laser beam used for preferred crystallization in the present invention must have cyclic characteristics in a laser intensity distribution thereof in order to allow a plurality of crystal seeds to simultaneously grow. This light intensity distribution can be formed by modulating the light intensity of the laser beam 21 emitted from an excimer laser device, e.g., a KrF laser excimer laser device by using a laser intensity modulation element, e.g., a phase shifter 22 shown in FIG. 3A. As to the laser beam 21, although an example of using the KrF laser is described here, it is possible to use any other laser, e.g., an XeCl laser as long as it has the light coherency and can emit the energy which is required for melting silicon. Additionally, any other energy rays may be used. Since the laser beam 21 has a very high coherency, when a member with a different refractive index such as glass is arranged in the light path of the laser beam 21, a phase difference from the incident laser beam is generated in the emitted parts of laser beam, due to a difference in refractive index of the member.

As the phase shifter 22, for example, a transparent substrate whose thickness varies in a light path direction, e.g., a quartz plate having a step portion or portions can be used. As shown in FIGS. 3A and 3B, by setting a phase difference at the part of a step portion 23 between rectangular elongated areas or parts 22a and 22b having different thicknesses to correspond to ½ of a laser wavelength, the laser beam 21 which has passed through the phase shifter is weakened by the interference of the parts of the laser beam 21, and a low-intensity portion or a minimum intensity area 24a of the laser beam is generated at a position corresponding to the step portion 23 in an application area. The intensity of the laser beam 21 is increased as distanced from the low-intensity portion 24a, and a high-intensity portion or a maximum intensity area 25a is generated. An inclined laser beam intensity of a laser beam intensity change area 26a between the low-intensity portion 24a and the high-intensity portion 25a is utilized for crystallization. Here, the present inventors have experimentally confirmed that a temperature distribution formed when the laser beam intensity distribution and the laser beam is applied onto the substrate has a strong correlation with positions and the relative intensity of the low-intensity portion 24a and the high-intensity portion 25a in the laser beam-irradiated area. It is desirable that the laser low-intensity portion 24a matches with a lowest-temperature portion 24 and the high-intensity portion 25a matches with a highest-temperature portion 25.

Figure 1E:
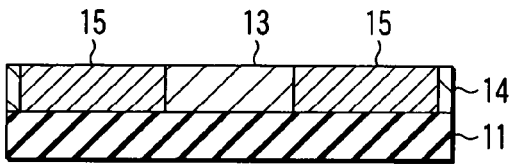

The crystal growth step described in conjunction with FIG. 1E will now be described in detail with reference to FIGS. 4A to 6B. Another embodiment shown in FIG. 2C is the same.

Figure 5A:
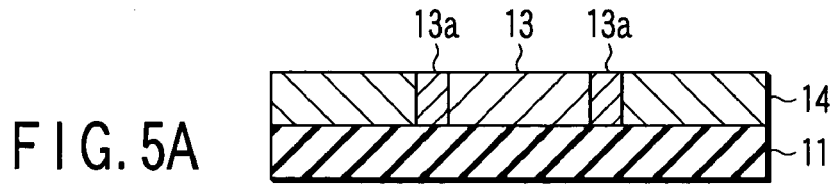
FIGS. 5A and 5B are views illustrating crystallization steps based on laser beam application depicted in FIGS. 4A and 4B.

The crystal growth step is performed by matching the lowest-temperature portion 24 generated when the laser irradiating energy shows the minimum value with a center 13b of the crystal seed 13 (indicated by a dotted line) shown in FIG. 4A. In FIG. 4A, a melting point (T1) of the amorphous silicon film is approximately 1000° C., and a melting point (T2) of crystallized silicon is approximately 1415° C. FIG. 4A shows a temperature distribution in the layer (the crystal seed 13 and the non-single-crystal semiconductor layer 14) immediately after irradiation of the laser beam 21. At this point in time, in the illustrated area, since a temperature in the entire area is more than the melting point (T1) of the non-single-crystal semiconductor layer 14 composed of the amorphous silicon film, the non-single-crystal semiconductor layer 14 is entirely melted. Further, a partial area 13a in the crystal seed 13 which is irradiated with the laser having an intensity corresponding to a temperature more than the melting point (T2) of the crystallized silicon is also melted. FIG. 5A shows this state. Therefore, since the partial area of the crystal seed 13 is melted, the remaining crystal seed without being melted becomes an area narrower than the original crystal seed 13. Thereafter, the crystal silicon at a position which has a solid-liquid boundary of the crystallized silicon becomes a growth nucleus, and crystal growth immediately starts.

Figure 5B:
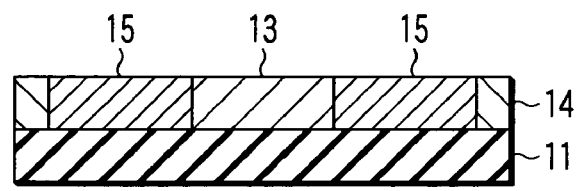

FIG. 4B shows a temperature distribution of the crystallized silicon when a predetermined time (t second) elapses after stopping the laser beam 21. Areas outside a temperature area sandwiched between points Q1 and Q2, in the vicinity of the center in the figure have a higher temperature than the melting point (T2) of the crystallized silicon. Thus, crystallization laterally advances in the non-single-crystal semiconductor layer 14, thereby forming the crystallized areas 15. FIG. 5B shows this state. Since crystallization advances taking the same crystal plane orientation as that of the crystal seed 13, the silicon single-crystal grain with a large particle size whose plane orientation is controlled can be formed by controlling the crystal plane orientation of the crystal seed 13. Furthermore, since the crystal nucleus exists, the supercooling state does not occur, and crystallization rapidly starts.

Figure 6A:
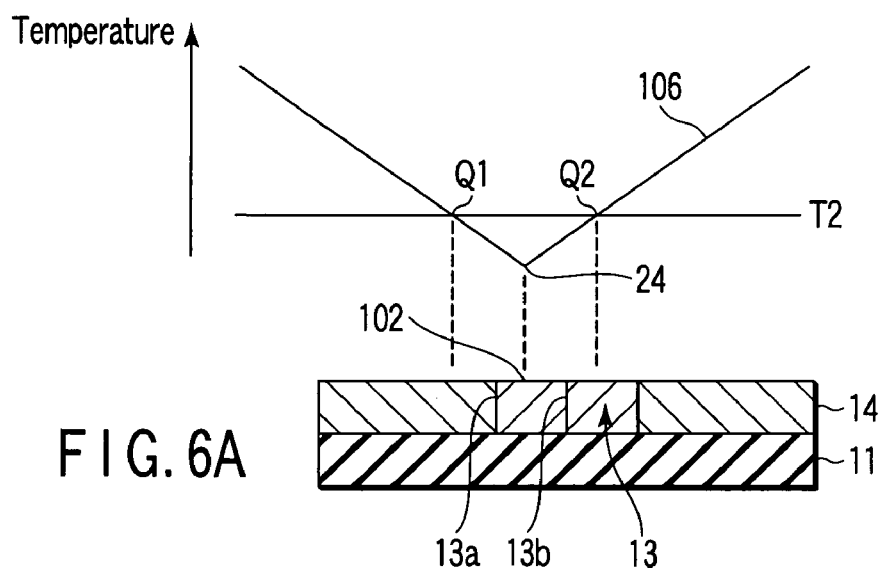
FIGS. 6A and 6B are views illustrating another embodiment of FIGS. 4A and 4B.

The description has been given as to the case in which the lowest-temperature portion 24 (minimum light intensity portion 24a) obtained by the laser beams having such a temperature distribution 106 as shown in FIG. 4A matches with the center 13b of the crystal seed 13 in the above-described embodiment. However, this portion does not necessary have to match with the center, and it is good enough for the lowest-temperature portion 24 to be placed at any position in the crystal seed 13. FIG. 6A shows an embodiment in which the lowest-temperature portion 24 is placed at a position shifted from the center 13b of the crystal seed 13.

FIG. 6A shows a case in which the lowest-temperature portion 24 is positioned on the left side of the center of the crystal seed 13. A temperature distribution 106 is formed on an irradiated surface by such laser application and, at this moment, the part of the crystal seed 13 placed between Q2 on the non crystal semiconductor layer 14 and the left end portion 13C of the crystal seed 13 remains without being melted. This state is constituted of the crystal seed 13d of the solid layer remaining without being melted and a state that the melted silicon which is in contact with the crystal seed 13d exists.

Figure 6B:
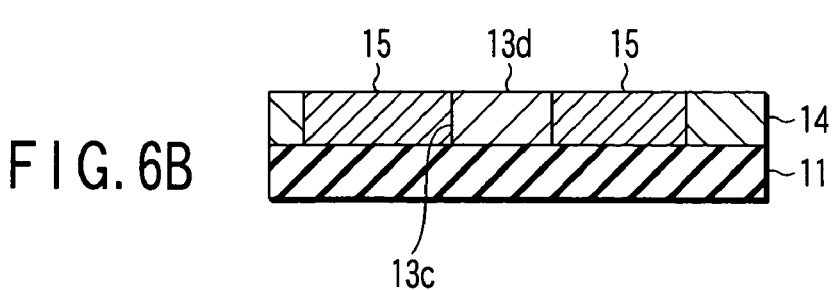

Thereafter, the lateral crystal growth starts with the crystal seed 13d remaining as the solid layer being used as a crystal nucleus, and the crystallized areas 15 is formed as shown in FIG. 6B. In this case, since crystallization likewise advances taking the same crystal plane orientation as that of the crystal seed 13, the silicon crystal grain with a larger particle size whose plane orientation is controlled can be formed by controlling the crystal plane orientation of the crystal seed or the crystal seed semiconductor layer 13. Moreover, since the crystal nucleus exists, the supercooling state does not occur, crystallization rapidly starts, and a long time required for the progress of crystallization can be assured. Thus there is formed a crystal which has a large particle size or is long in the lateral direction.

A description will now be given as to an example of an apparatus which automatically matches the lowest-temperature portion 24 with a position of the crystal seed 13 and crystallizes the amorphous silicon film with reference to FIG. 7.

An opto-spatial modulation element, e.g., a phase shifter 22 shown in FIG. 3A is provided in a path of the energy ray, e.g., a path of the laser beam from the KrF laser beam source 40 to modulate the light intensity of the laser beam emitted from the beam source 40. The laser beam source has a laser beam generation device and a homogenizer which homogenizes the intensity of the laser beam generated by this generation device. Thus, the laser beam with the homogenized intensity enters the phase shifter 22.

Generally, assuming that a wavelength of the laser beam 21 is $\lambda$, a film thickness t of a transparent medium which is used to provide a phase difference of 180 degrees to the transparent medium with a refractive index n is $t=\lambda/\{2\times(n-1)\}$. As to the phase shifter 22, assuming that a wavelength of the KrF excimer laser is 248 nm and a refractive index of a quartz base substance forming the phase shifter 22 is 1.508, a step of the step portion 23 which is used to provide a phase difference of 180 degrees to the incident laser beams is 244 nm. Therefore, as the phase shifter 22, there can be used one having a step of 244 nm at a predetermined position of the quartz base substance.

The incident laser beam 21 is diffracted and interfered by this phase shifter 22, and a cyclic spatial distribution is given to the intensity of the laser beam 21. That is, a part of the laser beam 21 which has passed through a thick part 22b of the phase shifter 22 is delayed as compared with a part of the laser beam 21 which has passed through a thin part 22a. As a result of mutual interference and diffraction between these parts of the laser beam 21, a passed laser beam intensity distribution shown in FIG. 3B can be obtained. FIG. 3B shows an example in which a phase difference of 180 degrees is provided on the right and left sides with the step portion 23 as a boundary (boundary portion).

A table 41 movable in a X, Y, Z, and $\theta$ directions is arranged in the laser beam path on the emitting radiation side of the phase shifter 22. The insulative base substance 11 (shown in FIGS. 1D and 2B) which has the crystal seed and has the amorphous silicon film to be crystallized formed thereon is fixed at a predetermined position on this moving table 41 by the known method. Thus, the laser beam intensity distribution shown in FIG. 3B is image-formed on the upper surface of the insulative base substance 11 (amorphous silicon film).

In this apparatus, in order to image the crystal seed 13 as a target provided on the insulative base substance 11, an imaging camera 42, e.g., an ITV camera is arranged above the table 41 on the slant. A circuit 43 for outputting target crystal seed positional information is connected to the output side of the imaging camera 42. The circuit 43 converts an analog signal into a digital signal, then outputs positional information of the crystal seed 13. A comparison circuit 44 is connected to the output side of the positional information output circuit 43. A circuit 45 for outputting lowest-temperature positional information is connected to the input side of the comparison circuit 44. The lowest-temperature positional information output circuit 45 outputs positional information of the lowest-temperature portion 24 stored therein in advance to the comparison circuit 44.

A table position control section 46 which is used to control a position of the moving table 41 is connected to the output side of the comparison circuit 44. The table position control section 46 has a drive mechanism which drives the moving table 41 in an X-Y-Z-$\theta$ direction, and a control circuit which controls driving of this drive mechanism. In this manner, there is configured means for positioning the lowest-intensity portion 24a in the passed laser beam intensity distribution to the crystal seed 13 of the insulative base substance 11.

A description will now be given as to a method for positioning the minimum light intensity portion 24a in the passed laser beam intensity distribution to the crystal seed 13 on the insulative base substance 11.

After fixing the insulative base substance 11 on the moving table 41, the crystal seed 13 as a target on this base substance 11 is imaged by the imaging camera 42, and imaging information from the camera 42 is supplied as an analog signal to the target crystal seed positional information output circuit 43. The circuit 43 coverts the supplied analog signal into a digital signal, and outputs positional information of the crystal seed 13 to the comparison circuit 44. The comparison circuit 44 compares the inputted positional information of the crystal seed with positional information of the lowest-temperature portion 24 from the lowest-temperature positional information output circuit 45, and executes a difference calculation of the both of positional information.

This difference calculation information is inputted to the table position control section 46, and used to control a position of the moving table 41. By repeating such a calculation, the moving table 41 stops at a position where a calculation output value of the comparison circuit 44 becomes zero. As a result, the lowest-temperature portion 24 in the passed laser beam intensity distribution is aligned to the crystal seed 13 on the insulative base substance 11. In this case, as described in conjunction with FIGS. 6A and 6B, the lowest-temperature portion 24 does not necessarily have to be aligned at the center of the crystal seed 13.

Figure 8A:
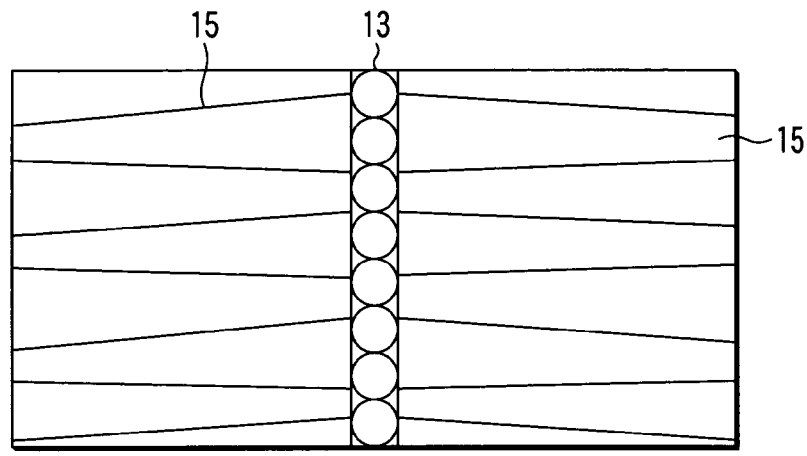
FIGS. 8A and 8B are plane views schematically showing a comparison between crystal grains crystallized by the crystallization steps described in conjunction with FIGS. 1A to 1E or FIGS. 2A to 2C and crystal grains crystallized by a conventional method, in which FIG. 8A concerns the present invention and FIG. 8B concerns the conventional example.

A time given to the crystal growth in the process according to the present invention is a time until the hour at which a predetermined area of the melted amorphous silicon film is cooled to a solidification temperature or below, which is approximately 60 n seconds. As to this time, as compared with the mode according to a prior art by which the crystal seed 13 is not formed in advance, the approximately 1.5-fold time is given. As a result, the lateral growth distance in this embodiment is longer than that in the prior art, and it becomes 3 to 4.5 μm. FIG. 8A shows an enlarged crystallized area or gram 15 subjected to crystal growth in the lateral direction from each crystal seed 13 according to the present invention. As apparent from FIG. 8A, in the lateral crystal growth in this embodiment, the crystals regularly grow in the lateral direction in good order from a stick-like or linear crystal seed 13 composed of an aggregation of small crystal grains 30A. The large elongated crystal grains regularly grown in good order can constitute even circuits without irregularities in operating characteristics when forming circuits such as thin film transistors.

Figure 8B:
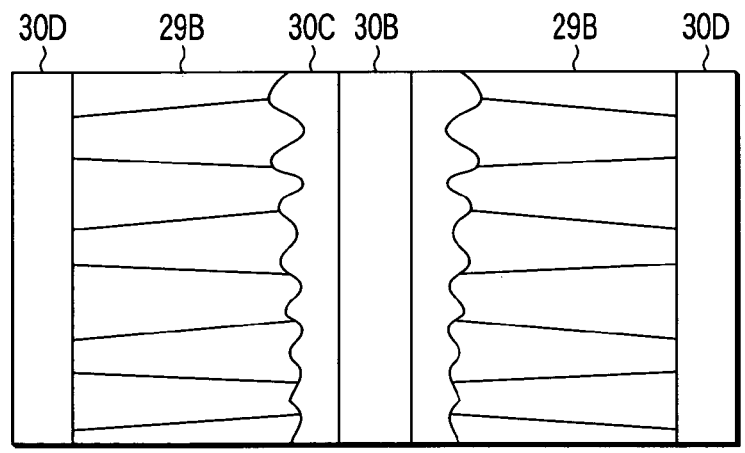

FIG. 8B schematically shows crystallized areas 29B obtained by the prior art which does not utilize a crystal seed. The prior art is laser annealing using a laser beam having a light intensity distribution which is upwardly concave. In regard to a central part of the laser annealing according to the prior art, since an area irradiated with the laser beam 21 has a relatively low temperature, this low-temperature portion becomes an area 30B which is not melted but melted part of the way in a thickness direction of the amorphous silicon film 12. Since a peripheral part of the laser annealing according to the prior art is a high-temperature area, the entire amorphous silicon film 12 in the thickness direction is melted, an area 30C in which this melted area irregularly wobbles is formed, and the lateral crystal growth starts from this wobbling or unstable area 30C, thereby forming the crystallized areas 29B. In FIG. 8B, reference numeral 30D denotes an amorphous silicon area which is not crystallized.

As apparent from the comparison between FIGS. 8A and 8B, comparing the lateral growth distance according to this embodiment with that according to the prior art, the crystallized area 15 formed by the method according to the embodiment of the present invention is a crystal which is 1.5-fold longer than the crystallized area 29B formed according to the prior art. This can be achieved since the supercooling state does not appear because of a use of the crystal seed and hence the long crystallization progress time can be assured. On the other hand, in regard to a crystal growth start position in the prior art, the temporal unevenness occurs in generation of the crystal nucleus because of the crystal growth from the supercooling state, and the position is not determined. As a result, in the prior art, a rim portion of the crystallization start point (the part of the area 30C) has a fixed wobble. In the present invention, since the supercooling state does not occur, there has been confirmed a result which demonstrates the high positional controllability that substantially no wobble is observed at the rim portion of the stick-like crystal seed 13 which is the crystal growth start position.

As described above, an increase in the crystallized area is an effect obtained by substantial elimination of the supercooling time and the resulting extension of the time given to the crystal growth. The highness of the positional controllability is an effect obtained from the previously arranged crystal seed 13 which is a nucleus of the crystal growth. Additionally, the crystal grain boundary generated in the crystallized silicon layer is a low-angle grain boundary, and it has been confirmed that this crystal grain boundary does not have a significant electrical impact.

The temperature distribution immediately after end of laser application has the condition that a part of the crystal seed 13 is melted and the remaining part is not melted in the above-described embodiment. However, the present invention is not restricted thereto, and any other condition may be used as long as the amorphous silicon part is melted and at least a part of the crystal seed silicon part remains without being melted. Since the melting point of the crystal seed silicon part is approximately 1000° C. and the melting point of the crystallized silicon is approximately 1415° C., it is good enough for a temperature at the boundary part between the crystal seed 13 and the amorphous silicon film 12 to fall within the range of 1000° C. to 1415° C. and, in the light of the process, the margin is wide.

Figure 9:
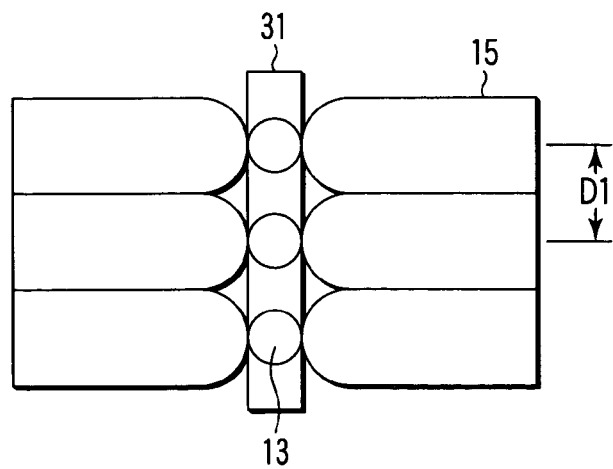
FIG. 9 is a plane view schematically showing a crystallized state when crystal seeds have a dot-like form in the embodiment according to the present invention.

FIG. 9 shows an example of the embodiment of the crystal growth when the crystal seeds 13 are linearly arranged in the dot-like form. In this example, there is a time in which no crystal growth is generated for approximately 20 n seconds (supercooling time) in an area 31 where the crystal seeds 13 do not exist. Thus, the crystal growth starts only from the dotted crystal seeds 13, and the crystal growth does not occur from any other position for 20 n seconds. A growth distance in this period is approximately 1 to 1.5 μm. Thus, by taking approximately 2 to 3 μm as a pitch (D1) of the crystal seed dot, each elongated crystallized area or crystal grain 15 of silicon with a width of approximately 2 to 3 μm which has grown in the lateral direction can be obtained with the excellent homogeneity as shown in FIG. 9.

An embodiment of a series of steps from formation of the crystal seed 13 to realization of the crystal growth will now be described with reference to FIGS. 10A to 10E.

Figure 10A:
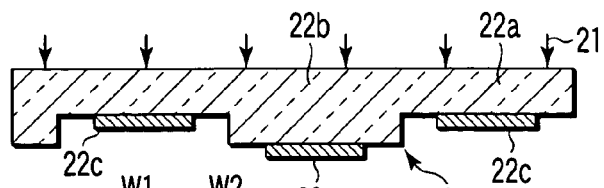
FIGS. 10A to 10E are views schematically showing a method for manufacturing a semiconductor layer according to another embodiment in a process order.
Figure 10B:
Figure 10C:

There is prepared an insulative base substance 11 having a non-single-crystal semiconductor, e.g., an amorphous silicon film 12 or 14 formed thereon (FIG. 10C).

As shown in FIG. 10A, the amorphous silicon film 12 is irradiated with a laser beam 21 through a phase shifter 22. The preferred phase shifter 22 has a structure in which transmittance restricting means for an energy ray such as prevention or half-transmission of the laser beam 21, e.g., light shielding masks 22c are combined with the phase shifter 22 shown in FIG. 3A. The masks 22c are added on at least one surface of a thick wall portion 22b and a thin wall portion 22a except both end portions (phase shift portion 23A having a step portion 23 at the center). As a result, the light shielding masks 22c and the phase shift portions 23A are alternately arranged in the lateral direction. The thick wall portion 22b and the thin wall portion 22a have a structure in which a plurality of zonal parts each of which has a relatively large thickness in quartz glass and a plurality of zonal parts each of which has a relative small thickness in quartz glass are alternately provided. Each of surfaces of these parts 22a and 22b has a rectangular shape which is elongated vertically with respect to a plane of the drawing. The light shielding mask 22c is designed in accordance with a design of the phase shift portion, and it may have any of a dotted shape, a zonal shape, a circular shape and others.

In a light intensity distribution (beam profile) of the laser beam 21 which has been transmitted through the thus configured phase shifter 22, as shown in FIG. 10B, an area corresponding to the phase shift portion 23A has a U or V shape, and an area corresponding to the step portion 23 forms a minimum intensity line. The distribution has a pattern constituted of a plurality light intensity distribution areas separated from each other in the lateral direction and a prevention area or a half-transmission area corresponding to the light shielding mask 22c positioned between these areas.

A width W1 of the light shielding mask 22c and a width W2 of the phase shift portion 23A depend on the design of the resultant crystal grain which is allowed to grow. For example, when forming a crystal grain which a particle size or length of approximately 5 μm, both the light shielding mask width (W1) and the phase shift portion width (W2) are determined as 10 μm, and the step portion 23 for a phase difference is provided at the central part of the phase shift portion in the widthwise direction.

The crystallization method will now be described. Irradiation of the laser beam 21 is performed through the phase shifter 22 (FIG. 10A) in a state that the insulative base substance 11 having a non-single-crystal Si film or, desirably, the amorphous silicon film 12 formed thereon is mounted on a precision moving table 41 (FIG. 7). The profile (P) depicted in FIG. 10B shows a light intensity distribution of the laser beam 21 whose light intensity has been modulated by the phase shifter 22. By the first laser irradiation, each crystallized seed 13 is generated in an area of the amorphous silicon film 12 irradiated with the laser beam 21 which has passed through the phase shift portion 23A or an opening portion as shown in FIG. 10C.

Figure 10D:
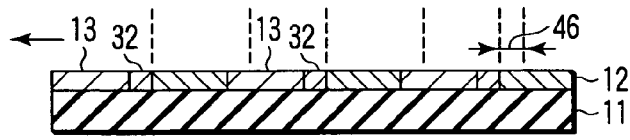

Then, as shown in FIG. 10D, the table 41 having the insulative base substance 11 mounted thereon is moved by a distance corresponding to ¼ of the phase shift portion width (W2) in the left-hand direction as indicated by an arrow, and the second laser irradiation is performed, thereby executing the lateral crystal growth processing from each crystal seed 13. In the second processing, a minimum light intensity portion 24a of the laser beam 21 is aligned (positioned) at a position overlapping the crystal seed 13 formed of the crystallized silicon film. At this time, by setting the light intensity of the minimum intensity portion 24a of the laser beam 21 to be higher than the melting point of the amorphous silicon film 12 and lower than the melting point of the crystallized silicon film, the crystal seed 13 formed of the crystallized silicon film functions as the crystal nucleus without being melted, and the lateral crystal growth starts, thereby generating a large crystal grain 32 (FIG. 10D).

Figure 10E:
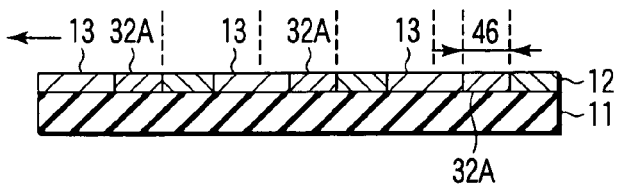

Then, the table having the insulative base substance 11 mounted thereon is further moved by a distance corresponding to ¼ of the phase shift portion width (W2) in the left-hand direction in the drawing. In this state, the third laser irradiation is carried out, and the lateral crystal growth processing is executed with the crystallized semiconductor or large crystal grain 32 being used as a new crystal nucleus. In the third processing, the minimum light intensity portion 24a of the laser beam 21 is aligned (positioned) at a position overlapping the crystal seed 32 formed of the crystallized silicon film. At this moment, the light intensity of the minimum intensity portion 24a of the laser beam 21 is set to be higher than the melting point of the amorphous silicon film 12 and lower than the melting point of the crystallized silicon film. As a result, the crystallized silicon film 32 functions as a crystal seed without being melted, and the lateral crystal growth starts, thereby generating a large crystal grain 32A obtained by increasing the crystal grain diameter (FIG. 10E). By repeating the above-described operation, a semiconductor film having grains of a large crystal grain diameter can be formed on the entire amorphous silicon film 12.

Another embodiment of the series of steps from formation of the crystal seed 13 to realization of the crystal growth will now be described with reference to FIGS. 11A to 11D.

In this embodiment, a modulation conformation of the laser beam 21 by the phase shifter 22 is different from that of the foregoing embodiment. Semi-permeable thin films or layers 22e are provided to the phase shifter 22 in order to appropriately attenuate an intensity of the laser beams 21. Transmittance restricting means for an energy ray such as opening portions or transparent parts 22f which are used to partially transmit the laser beam 21 therethrough without being attenuated is provided to the same. That is, the phase shifter 22 comprises a thick wall portion 22b and thin wall portion 22a provided to a transparent body, e.g., quartz glass, a step portion 23 between the thick wall portion 22b and the thin wall portion 22a, and a semi-permeable thin film or layer 22e having the opening portion 22f provided on one surface of the thick wall portion 22b and the thin wall portion 22a.

The thick wall portion 22b and the thin wall portion 22a have a structure in which a plurality of zonal parts having a relatively large thickness in the quartz glass and a plurality of zonal parts having a relatively small thickness in the quartz glass are alternately provided. The semi-permeable thin film 22e may have any of a dotted shape, a zonal shape, a circular shape and others, and the opening portion 22f may have any of a dotted shape, a zonal shape, a circular shape and others. The semi-permeable thin film 22e is configured to cover the phase shift portion 23A. Arrangements, dimensions and others of the semi-permeable film 22e and the phase shift portion 23A depend on the design of a crystal grain to be formed. The semi-permeable film 22e is produced, for example, by forming a silicon nitride film which is approximately 10 nm on, e.g., quartz glass of the phase shifter 22. Further, any other material, e.g., a silicon oxynitride film may be utilized as long as a necessary permeability can be obtained.

Using this method can form a crystal grain whose size is ½ of a gap between the respective phase shift portions 23A in the laser crystallization processing for one time. For example, in order to form a crystal grain which is 5 μm in the first laser processing, a gap between the phase shift portions 23A is determined as 10 μm. The opening portion 22f of the semi-permeable film 22e is formed between the adjacent phase shift portions 23A.

Figure 11A:
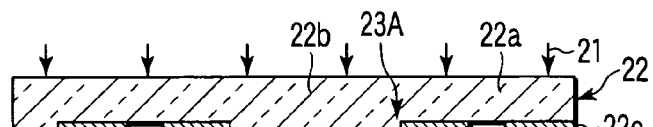
FIGS. 11A to 11D are views schematically showing a method for manufacturing a semiconductor layer according to still another embodiment in a process order.
Figure 11B:
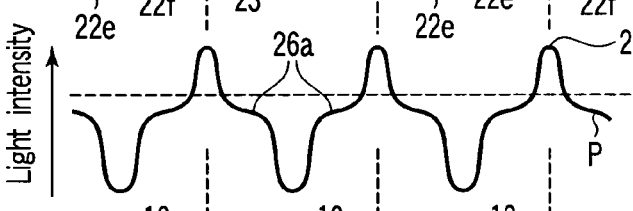

The phase shifter 22 functions as a filter through which such transmitted light beam as shown in FIG. 11B passes. The characteristics of the filter indicate light intensity distribution (profile) characteristics having a maximum light intensity area, a U- or V-shaped light intensity distribution area, and an intermediate intensity are. The first area is obtained by a part of the transmitted light beam which has been transmitted through the opening portion 22f. The second area is a line or a point corresponding to the step portion 23 has a minimum light intensity by a part of the transmitted light beam which has been transmitted through the phase shift portion 23A. The third area has an intermediate light intensity between the maximum light intensity and the minimum light intensity by a part of the transmitted light beams which have been transmitted through the semi-permeable film 22c. A chain line extending in the lateral direction in FIG. 11B is indicative of the melting point (T1) of an irradiation target body, i.e., the amorphous silicon. The phase shifter 22 enables a step to create a crystal seed to the amorphous semiconductor layer 12 or 14 and perform crystallization from this crystal seed.

Figure 7:
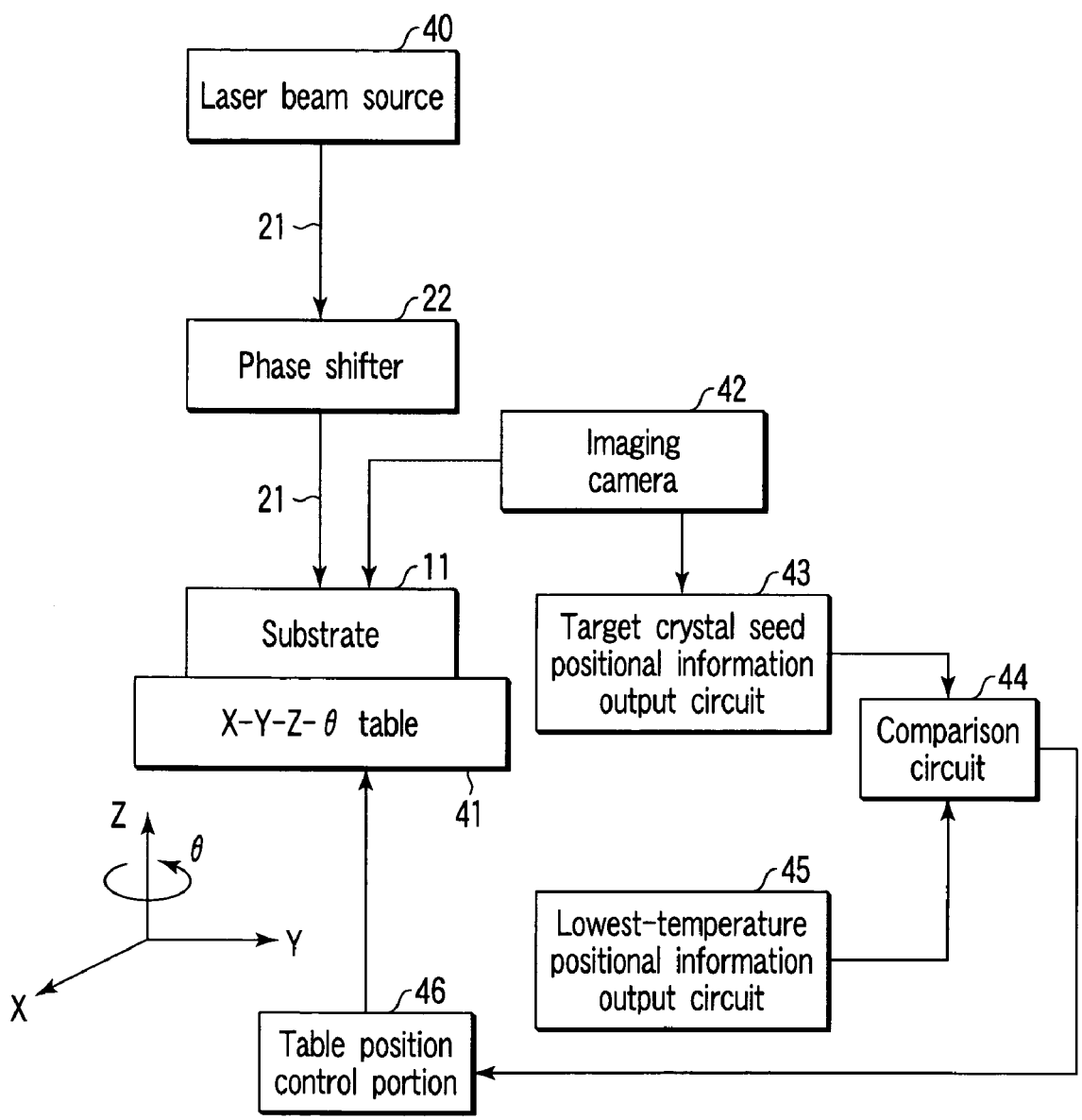
FIG. 7 is a system block diagram illustrating an embodiment which automatically positions the irradiation position of laser beams having the light intensity distribution depicted in FIG. 4B and the crystal seed.

The first laser processing is performed in a state that the insulative base substance 11 having the non-single-crystal semiconductor layer 14 formed thereon is mounted on the precision table 41 (FIG. 7). The phase shifter 22 shown in FIG. 11A emits the laser beam 21 having such a light intensity distribution (laser beam distribution (p)) of the laser beam 21 as shown in FIG. 11B therefrom by modulating the entered laser beam 21. At this time, in the phase shift portion 23A, the intensity of the laser beam 21 is reduced by the effect of interference and diffraction, and a U-shaped light intensity distribution pattern having a minimal or minimum intensity portion 24a is outputted. The laser beam 21 is transmitted through the opening portion 22f of the semi-permeable film on the phase shifter 22 without being attenuated, and a maximal light intensity portion 25a (high-temperature portion 25) of the laser beam 21 is generated. In this manner, the laser beam intensity distribution P can be formed.

Figure 11C:

The crystallization method will now be concretely described. In the following, the high-temperature portion 25 having a temperature distribution formed by the high light intensity portion 25a of the laser beam and the low-temperature portion 24 having a temperature distribution formed by the low light intensity portion 24a of the same are used for the explanation. Although the high-temperature and the low-temperature portions in the amorphous silicon film 12 are not illustrated, a high-temperature portion formed by the high light intensity portion 25a and a low-temperature portion formed by the low light intensity portion 24a are illustrated. In the first crystallization processing, adjustment is carried out in such a manner that an intensity in the high intensity portion 25a of the laser beam 21 completely melts the amorphous silicon film irradiated with the laser beam but an intensity of the intermediate intensity portion 26a of the laser beam 21 does not melts the same. In this state, the excimer laser beam 21 is applied for several shots or, preferably, 10 shots or more. As a result, only an area irradiated with the high intensity portion 25a of the laser beam 21 is crystallized, and the crystal seed 13 is formed. At this time, when crystallization is performed under the above-described condition, a plane of the generated crystal is oriented in (111) (FIG. 11C).

Figure 11D:

Then, as shown in FIG. 11D, the X-Y-Z-θ table 41 having the insulative base substance 11 mounted thereon is moved in one direction indicated by an arrow, e.g., an X direction. In this example, the substrate is moved by a predetermined distance L1 in the left-hand direction in the drawing. As to this moving distance, the substrate is moved in such a manner that each lowest-temperature portion 24 of the laser beam 21 is aligned at the substantially central part of each crystal seed 13 crystallized by the first laser processing.

Thereafter, the lateral crystallization step is carried out by using as the crystal seed 13 the semiconductor layer crystallized by the second laser beam irradiation processing with respect to the moved insulative base substance 11. At this time, by setting the laser intensity in such a manner that the lowest-temperature portion 24 generated by the light intensity of the minimum intensity portion 24a becomes not less than the melting point of the amorphous silicon and not more than the melting point of the crystallized silicon, the part crystallized by the first laser processing becomes a crystal growth nucleus (crystal seed 13) for the lateral growth of the amorphous silicon film. As a result, there is generated the lateral growth having almost no supercooling time at the crystallized semiconductor layer 32 part which has grown from the amorphous silicon film, and the crystal growth distance becomes 1.5-fold as compared with that in the prior art in which the crystal grows from the amorphous silicon film. Furthermore, since the crystal seed 13 is oriented in the plane (111), the crystal growth direction of the crystallized silicon portion 32 obtained by the second laser beam irradiation becomes (110) (FIG. 11D).

After the second crystallization processing, a predetermined uncrystallized area is moved to the crystallization light path by moving, e.g., the glass substrate, and the first and second crystallization processing steps are sequentially carried out, thereby forming the crystallized semiconductor film composed of crystal grains with a large particle size over the entire film.

According to the various embodiments mentioned above, the large crystal grain or the silicon layer which demonstrates a performance according to the large crystal grain can be formed at a desired position on the insulative base substance 11, e.g., the glass substrate. In any embodiment, a positional relationship between the island-shaped mark and the single-crystal grain is determined, thereby coping with the thin film transistor forming step based on this relationship.

With reference to FIGS. 12A to 12D, a description will now be given as to a formation conformation of a thin film transistor by using a single crystal grain or an Si layer according to the single crystal grain, and a CMOS circuit manufactured by using such transistors. Here, "according to the single crystal grain" means a crystal grain which does not have a crystal grain boundary which runs across a channel portion between a source electrode 35 and a drain electrode 36 of a thin film transistor. Since the crystal grains obtained in the present invention have crystal grain boundaries which are parallel with each other at fixed intervals, directions of the crystal and the transistor do not have to be exactly matched with each other when forming a transistor circuit 29C by using a single-crystal grain which is one crystallized area 15. When there is a crystal grain boundary in a transistor formation area, by matching directions in which currents flow through the crystal grain boundary and the transistor with each other, it is possible to obtain a very small value with which excellent transistor characteristics, e.g., mobility characteristics of electrons or electron holes are unified.

Figure 12A:
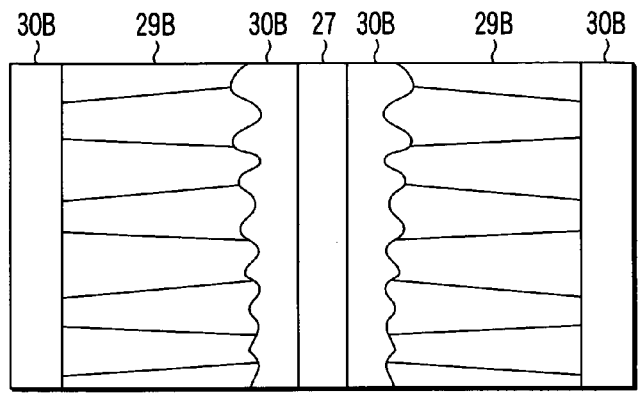
FIGS. 12A to 12D are views illustrating an embodiment in which an MOS transistor which is formed in a crystallized area of the semiconductor layer depicted in FIG. 1E is formed to pass a current in a grain boundary direction.
Figure 12B:
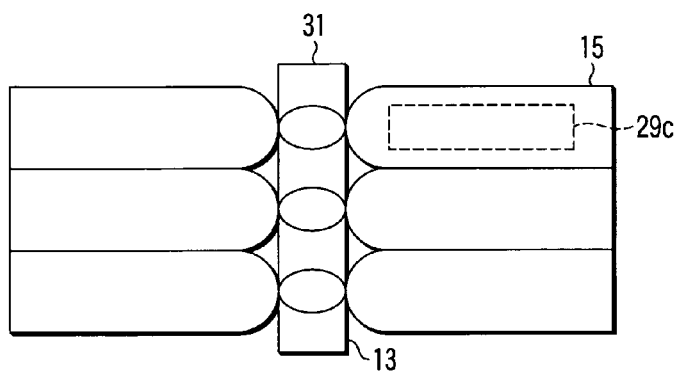

As shown in FIG. 12A, since the crystal grains obtained by the prior art have crystal grain boundaries which are not parallel with each other and do not have fixed intervals, it is hard to form a transistor to prevent crystal grain boundaries from existing in a channel of the transistor.

Figure 12C:
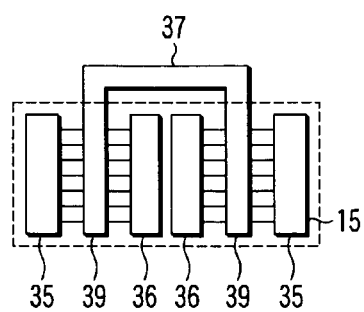

When forming the transistor, a single-crystal grain or an Si layer according to the single-crystal grain is islanded based on a non-illustrated provided positioning mark. Patterning of formation of the island is carried out by a photo-etching step. Subsequently, a silicon oxide film for a gain insulating film is formed on an upper surface of each islanded Si layer as shown in FIG. 12C. Then, of this silicon oxide film, parts corresponding to the gate area and the drain area are removed to expose parts of the Si layer. Subsequently, the source electrode 35 and the drain electrode 36 are formed on these exposed parts, and a gate electrode 37 is formed on each part of the silicon oxide film between these electrodes 35 and 36. As a result, a double gate MOS in which two channels are formed in alignment is formed in the crystal grain or single-crystallized area 15 in such a manner that no crystal grain boundary exists in the channel.

Figure 12D:
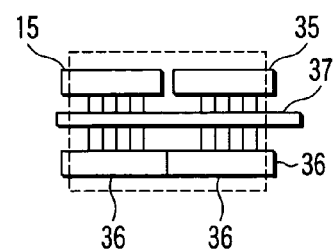

Alternatively, when the two transistors having the MOS structure are positioned and formed in the same crystal grain 15 as shown in FIG. 12D, irregularities in characteristics of the transistors, e.g., mobility characteristics of electrons or holes due to irregularities or the like in properties of different crystal grains can be advantageously suppressed to a very small value. Since the channel of the thus manufactured thin film transistor does not include a crystal grain boundary which runs across this channel, it is possible to obtain performances comparable to an MOS or SOI device formed on a single-crystal Si wafer.

A switching circuit, a control circuit, a logic circuit or the like of an electro-optic device such as a liquid crystal display device can be formed by using such a thin film transistor. The method for forming a thin film transistor to a crystallized crystal grain can be formed as follows.

A structure of a CMOS using the thin film transistor will now be more concretely described with reference to FIG. 13.

Figure 13:
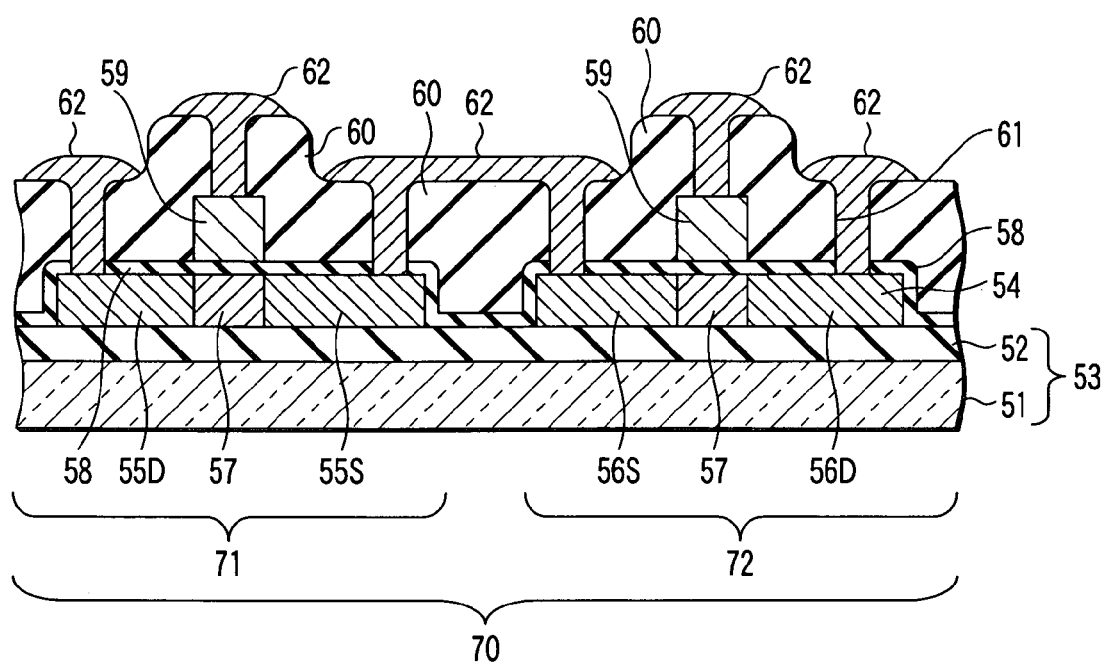
FIG. 13 is a view illustrating a structure of a CMOS thin film transistor formed in a crystallized area of the semiconductor layer depicted in FIG. 1E.

As shown in FIG. 13, a semiconductor layer 54 composed of a substantially single crystal silicon layer or the like is formed on an upper surface of an insulative substrate 53 having an insulating layer formed on an upper surface of a transparent insulative base substance 51 consisting of, e.g., glass. A gate insulating film 58 composed of an oxide film, e.g., an $SiO_2$ film is formed on the upper surface of this semiconductor layer 54. A gate electrode 59 composed of a metallic layer is formed on an upper surface of the gate insulating film 58. A pair of an n-type source area 55S and an n-type drain area 55D, and a pair of p-type source area 56S and a p-type drain area 56D are formed in the semiconductor layer 54.

Each channel area 57 is formed between the n-type source area 55S and the n-type drain area 55D and between the p-type source area 56S and the p-type drain area 56D in such a manner that it is positioned below the gate electrode 59. A form in which the gate electrode 59 is formed above the channel area 57 in this manner is referred to as a top gate type thin film transistor. Upper surfaces of the semiconductor layer 54 and the gate electrode 59 are covered with an interlayer insulating layer 60.

Each wiring layer 62 is electrically connected with each of the n-type source area 55S, the n-type drain area 55D, the p-type source area 56S and the p-type drain area 56D through each contact hole 61. In this manner, there are formed an n-channel type MOS transistor 71 composed of the source area 55S, the drain area 55D and the channel area 57, and a p-channel type MOS transistor 72 composed of the source area 56S, the drain area 56D and the channel area 57. In the two MOS transistors 71 and 72 having different polarities, the source area 55S is electrically connected with the source area 56S, thereby constituting a CMOS 70.

An outline of a manufacturing step of the CMOS 70 illustrated in FIG. 13 will now be described with reference to FIGS. 14A to 14L.

Figure 14A:
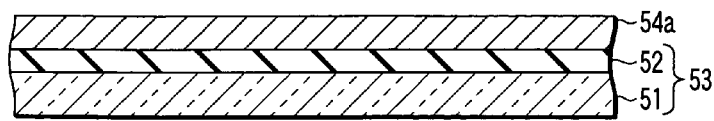
Figure 14B:
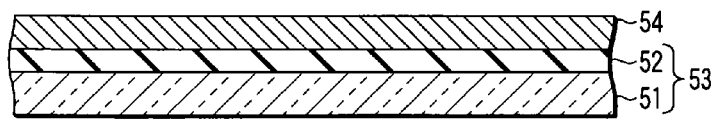

The insulating layer 52 of an oxide film consisting of, e.g., $SiO_2$, SiN or a combination of these substances is formed on the entire upper surface of the transparent insulating substrate 11 formed of glass, thus constituting the insulative substrate 53. Then, an amorphous semiconductor thin film or layer 54a composed of amorphous silicon is formed on the upper surface of the insulating layer 52 (FIG. 14A). Subsequently, this amorphous semiconductor layer 54a is crystallized into polycrystal silicon, single-crystal silicon or a semiconductor thin film or layer 54 according to the single-crystal silicon by the method according to the present invention (FIG. 14B).

Figure 14C:
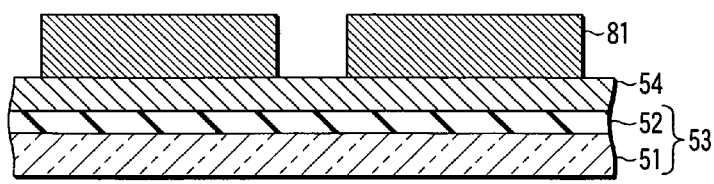
Figure 14D:
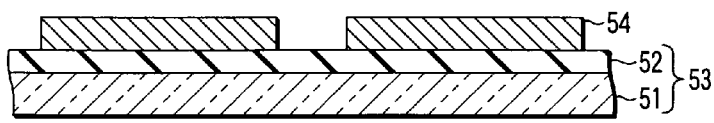
Figure 14E:
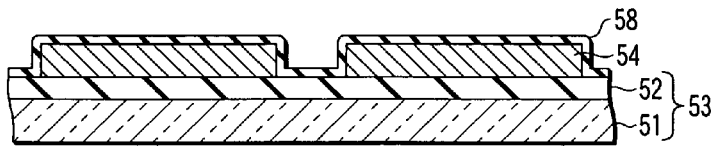
Figure 14F:
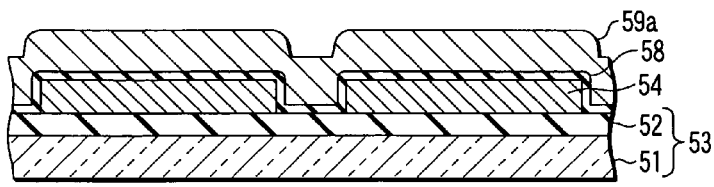

Then, in order to define a shape of an active area by using the photolithography method, a resist film 81 is selectively formed on the upper surface of the semiconductor layer 54 (FIG. 14C). At this time, the active area is positioned to be formed on a single-crystal grain or silicon according to the single crystal in such a manner that the channel area 57 of the transistor shown in FIG. 13 can be formed. After etching the semiconductor layer 54 by using the resist film 81 as a mask and shaping the layer 54 into island-shaped areas, the resist film 81 is removed (FIG. 14D). The gate insulating film 58 is formed on the upper surfaces of the insulative substrate 53 and the island-shaped semiconductor layers 54 (FIG. 14E). Then, an electroconductive layer 59a which is used to form a gate electrode is formed on the gate insulating film 58 (FIG. 14F).

Figure 14G:
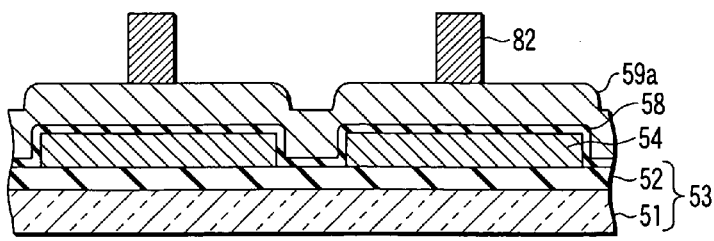

A resist film 82 is selectively formed on the upper surface of the electroconductive layer 59a in order to define a shape of the gate electrode by using the photolithography method (FIG. 14G). The electroconductive layer 59a is etched with this resist film 82 being used as a mask, the gate electrodes 59 are formed, and then the resist film 82 is removed (FIG. 14H). Subsequently, a resist film 83a which becomes a mask for introducing impurities is selectively formed in a p-channel type MOS transistor formation area. By using the resist film 83a and the exposed gate electrode 59 as masks, n-type impurities 550 are implanted by implantation as indicated by arrows only in areas which become a source area and a drain area in the semiconductor layer or island-shaped area 54 which becomes an n-channel type MOS transistor, thereby forming the n-type source area 55S and the n-type drain area 55D (FIG. 14I). Then, the resist film 83a is removed.

Subsequently, a resist film 84a which becomes a mask for introducing impurities is selectively formed in an n-channel type MOS transistor formation area. By using the resist film 84a and the exposed gate electrode 59 as masks, p-type impurities 560 are implanted only in the semiconductor layer 54 which becomes a p-channel type MOS transistor as indicated by arrows, thereby forming the p-type source area 56S and the p-type drain area 56D (FIG. 14J). The resist film 84a is removed. Then, the interlayer insulating layer 60 is formed on the entire surfaces of the gate electrode 59, the gate insulating film 58 and the insulative substrate 53 (FIG. 14K). A heat treatment step which activates impurity atoms added in the semiconductor layer 54 is performed.

Subsequently, a resist film (not shown) which is used to from contact holes is selectively formed on the upper surface of the interlayer insulating layer 60. By using this resist film as a mask, the interlayer insulating layer 60 is etched, thereby forming each contact hole 61 reaching each of the gate electrode 59, the drain area 55D, the source area 55S, the drain area 56D and the source area 56S. After removing this resist film, each electroconductive layer which becomes a wiring layer is formed in each contact hole 61 and on the upper surface of the interlayer insulating layer 60, and patterning is applied to provide a predetermined wiring pattern, thereby forming each wiring layer 62. The CMOS 70 is brought to completion by the above-described steps (FIG. 14L).

An example of a liquid crystal display apparatus using the thin film transistors manufactured by the present invention will now be described with reference to FIGS. 15 to 17.

Figure 15:
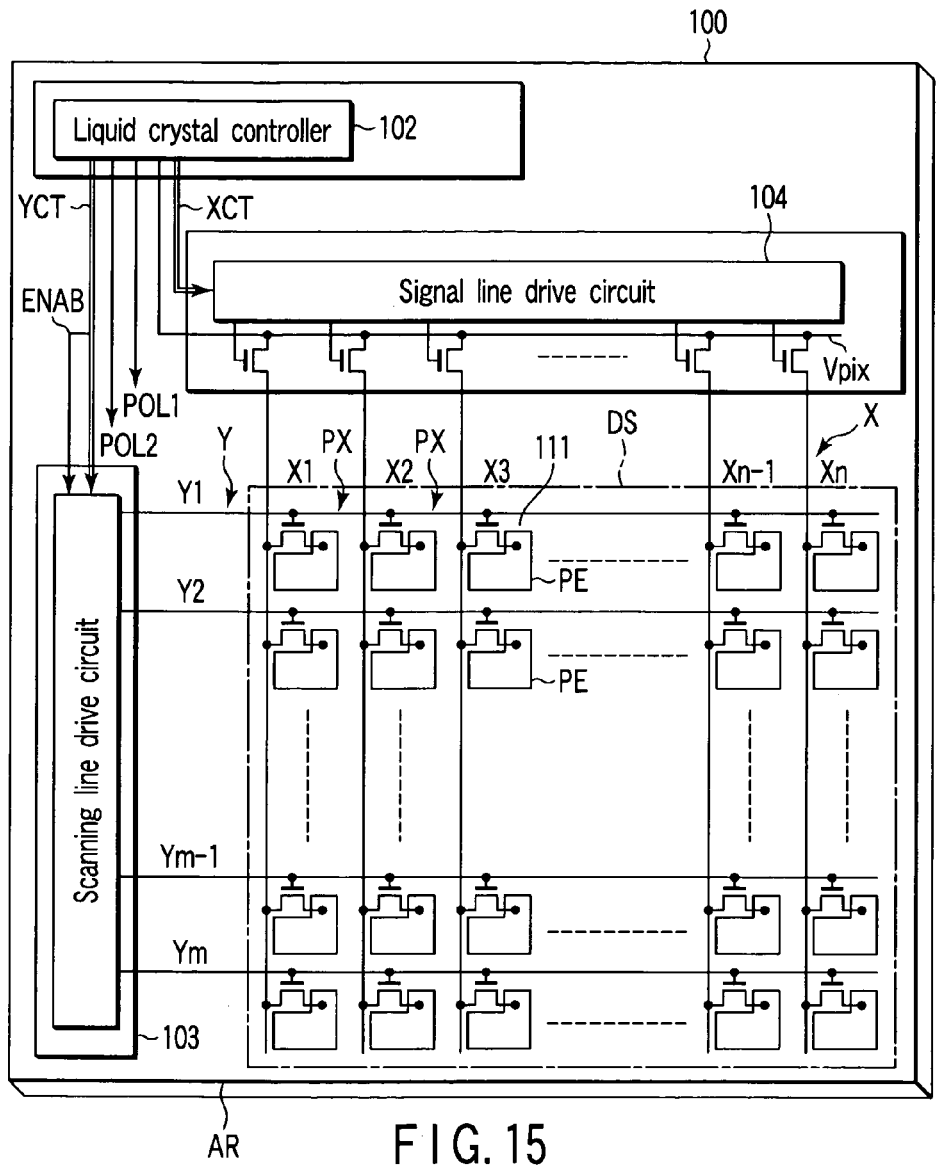
FIG. 15 is a view illustrating an example in which a display apparatus according to an embodiment of the present invention is applied to a liquid crystal display apparatus.
Figure 16:
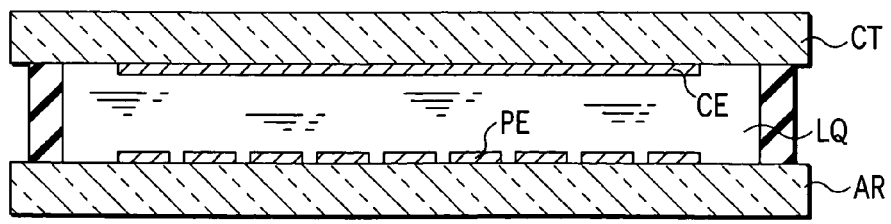
FIG. 16 is a cross-sectional view of the liquid crystal display apparatus depicted in FIG. 15.
Figure 17:
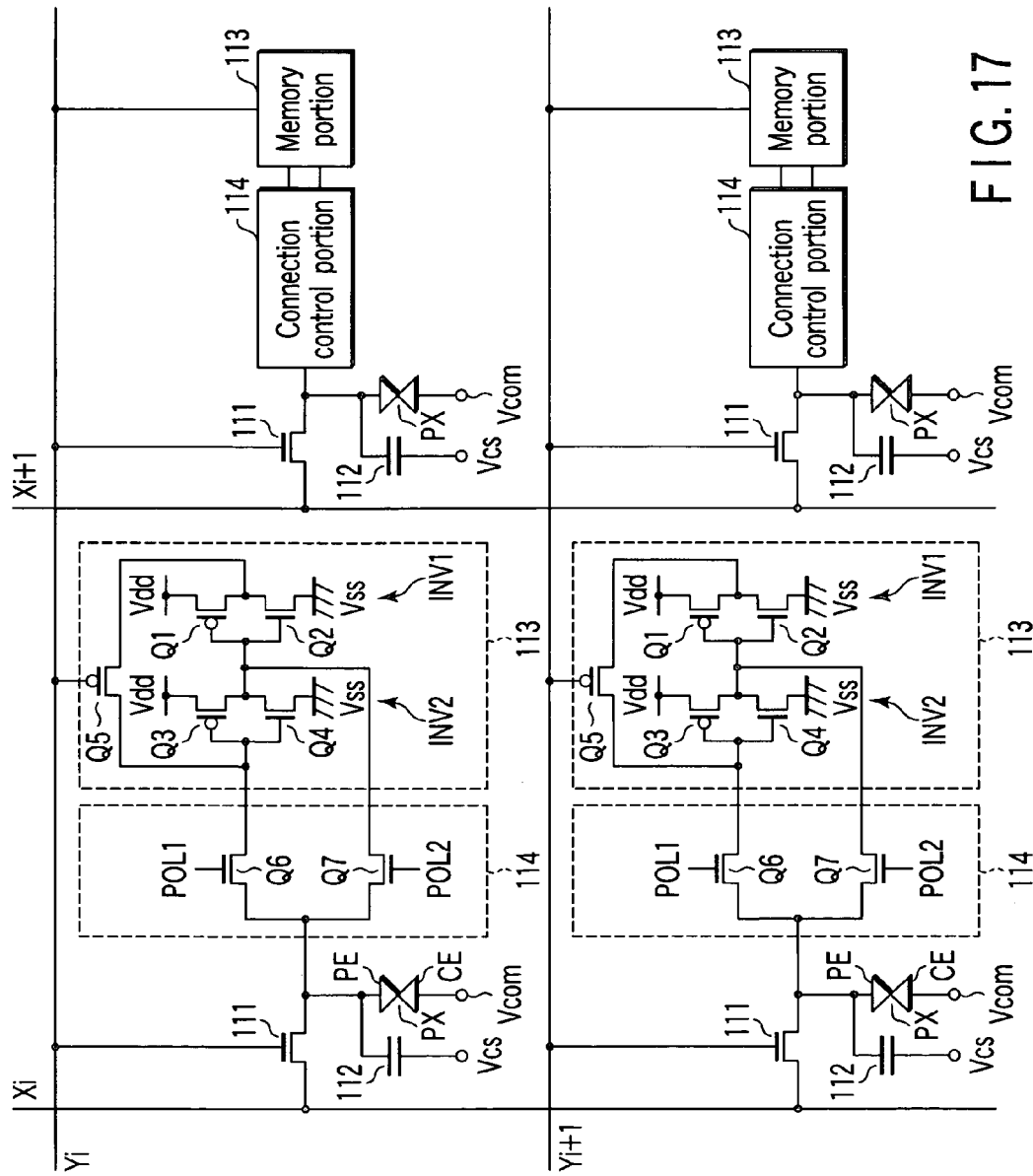
FIG. 17 is a circuit diagram illustrating a display pixel peripheral control circuit depicted in FIG. 15.

FIG. 15 shows a schematic circuit configuration of this liquid crystal display apparatus, FIG. 16 shows a schematic cross-sectional structure of this liquid crystal display apparatus, and FIG. 17 shows an example in which new functions are given to an equivalent circuit of a display pixel peripheral control circuit depicted in FIG. 15 and the inside of a pixel. As shown in FIG. 15, the liquid crystal display apparatus includes a liquid crystal display panel 100 and a liquid crystal controller 102 which controls the liquid crystal display panel. As shown in FIG. 16, the liquid crystal display panel 100 has a structure in which, e.g., a liquid crystal layer LQ is held between an array substrate AR and an opposed substrate CT, and the liquid crystal controller 102 is arranged at an outer edge portion of the liquid crystal display panel 100.

The array substrate AR has a plurality of pixel electrodes PE arranged in a matrix form in a display area DS on a transparent glass substrate. A plurality of scanning lines Y (Y1 to Ym) extending along rows of the pixel electrodes PE and a plurality of signal lines X (X1 to Xn) extending along columns of the plurality of pixel electrodes PE are provided on the glass substrate. The pixel electrode PE and a pixel switching element 111 are arranged at each of intersection positions between the signal lines X1 to Xn and the scanning lines Y1 to Ym. Each pixel switching element 111 fetches a video signal Vpix from a corresponding signal line X in response to a scanning signal from a corresponding scanning line Y, and applies it to a corresponding pixel electrode PE. A scanning line drive circuit 103 which drives the scanning lines Y1 to Ym and a signal line drive circuit 104 which drives the signal lines X1 to Xn are provided on the outer side of the display area DS on the glass substrate. The pixel switching element 111 is a control circuit, and constituted of a silicon thin film transistor which is formed as described in conjunction with the foregoing embodiments and has, e.g., an n channel polycrystal or single-crystal silicon layer.

Each of the scanning line drive circuit 103 and the signal line drive circuit 104 is constituted of silicon thin film transistors which have a plurality of polycrystal or single-crystal channel or substantially single-crystal areas formed on the array substrate AR as described in connection with the foregoing embodiments like the thin film transistor of the pixel switching element 111. The opposed substrate CT has a transparent glass substrate, a single opposed electrode or common electrode CE which is formed on an inner surface of the glass substrate, arranged to be opposed to the plurality of pixel electrodes PE and set to a common potential Vcom, and a non-illustrated color filter.

The liquid crystal controller 102 receives, e.g., a video signal and a synchronization signal supplied from the outside, and generates a pixel video signal Vpix, a vertical scanning control signal YCT and a horizontal scanning control signal XCT in a regular display mode. The vertical scanning control signal YCT includes, e.g., a vertical start pulse, a vertical clock signal, an output enable signal ENAB and others, and is supplied to the scanning line drive circuit 103. The horizontal scanning control signal XCT includes a horizontal start pulse, a horizontal clock signal, a polarity reversal signal and others, and is supplied to the signal line drive circuit 104 together with the video signal Vpix.

The scanning line drive circuit 103 is constituted of a shift register, and controlled by the vertical scanning control signal YCT to sequentially supply scanning signals, which are used to turn on the pixel switching element 111, to the scanning lines Y1 to Ym every vertical scanning (frame) period. The shifter register of this circuit 103 selects one of the plurality of scanning lines Y1 to Ym by shifting a vertical start pulse supplied every vertical scanning period in synchronization with the vertical clock signal, and outputs the scanning signal to the selected scanning line by making reference to the output enable signal ENAB. The output enable signal ENAB is maintained at a high level in order to allow an output of the scanning signal in an effective scanning period in the vertical scanning (frame) period, and maintained at a low level in order to prohibit the output of the scanning signal in a vertical blanking period excluding the effective scanning period from the vertical scanning period.

The signal line drive circuit 104 has a shift register and a sampling output circuit, and is controlled by a horizontal scanning control signal in such a manner that it serial/parallel-converts a video signal inputted in one horizontal scanning period (H) in which each scanning line Y is driven by the scanning signal and supplies an analog video signal Vpix sampled as a pixel display signal to each of the signal lines X to Xn.

The common electrode CE is set at a common potential Vcom as shown in FIG. 17. A level of the common potential Vcom is reversed from one of 0 V and 5 V to the other one every horizontal scanning period (H) in the regular display mode, and further reversed from one of 0 V and 5V to the other one every frame period (F) in a still picture display mode. Further, in the regular display mode, in place of reversing the level of the common potential Vcom in accordance with each horizontal scanning period (H) like this embodiment, the level of the common potential Vcom may be reversed every two H or every frame period (F), for example.

The polarity reversal signal is supplied to the signal line drive circuit 104 in synchronization with the level reversal of the common potential Vcom. The signal line drive circuit 104 performs the level reversal and outputs a result in response to the polarity reversal signal in such a manner that the video signal Vpix having an amplitude of 0 V to 5 V has a reverse polarity with respect to the common potential Vcom in the regular display mode, and stops the operation after outputting the video signal restricted in gradation for a still picture in the still picture display mode.

The liquid crystal layer LQ of this liquid crystal display panel 100 is "normally white" in which black display is carried out by applying to the pixel electrode pE, e.g., the video signal Vpix which is 5 V with respect to the common potential Vcom of 0 V set to the common electrode CE. As described above, there is adopted H common reversal driving in which a potential relationship of the video signal vpix and the common potential vcom is alternately reversed in accordance with each horizontal scanning period (H) in the regular display mode, and there is adopted frame reversal driving in which it is alternately reversed in accordance with each frame in the still picture display mode.

The display screen is constituted of a plurality of display pixels PX. Each display pixel PX includes the pixel electrode PE, the opposed electrode CE and a liquid material of the liquid crystal layer LQ held between them. Furthermore, a plurality of static memory portions 113 and a plurality of connection control portions 114 are provided with respect to the plurality of display pixels PX. As shown in FIG. 17, the pixel electrode PE is connected with the pixel switching element 111 which selectively fetches the video signal Vpix on this signal line X, and further capacitive-coupled with an auxiliary capacitance line set at a potential Vcs equal to the common potential Vcom of the common electrode CE, for example. The pixel electrode PE and the opposed electrode CE constitute a liquid crystal capacitance through the liquid crystal material, and the pixel electrode PE and the auxiliary capacitance line constitute an auxiliary capacitance 112 which is parallel with the liquid crystal capacitance without using the liquid crystal material.

The pixel switching element 111 applies the video signal Vpix on the signal line X to the display pixel px when driven by the scanning signal from the scanning line Y. The auxiliary capacitance 112 has a capacitance value which is sufficiently larger than the liquid crystal capacitance, and is charged/discharged by the video signal Vpix applied to the display pixel PX. When the auxiliary capacitance 112 holds the video signal Vpix by the charging/discharging, this video signal Vpix compensates fluctuations in the potential held in the liquid crystal capacitance when the pixel switching element 111 enters a non-conductive state, and a potential difference between the pixel electrode PE and the opposed electrode CE is thereby maintained.

Each static memory portion 113 has p channel thin film transistors Q1, Q3 and Q5 and n channel thin film transistors Q2 and Q4 formed as described in conjunction with the foregoing embodiments, and holds a video signal Vsig applied from the pixel switching element 111 to the display pixel PX. Each connection control portion 114 has N channel thin film transistors Q6 and Q7, and also functions as a polarity control circuit which controls not only an electrical connection between the display pixel PX and the static memory portion 113 but also an output polarity of a video signal held in the static memory portion 113.

The thin film transistors Q1 and Q2 constitute a first inverter circuit INV1 which operates at a power supply voltage between a power supply terminal Vdd (=5 V) and a power supply terminal Vss (=0 V), and the thin film transistors Q3 and Q4 constitute a second inverter circuit INV2 which operates at a power supply voltage between the power supply terminals Vdd and Vss. An output end of the first inverter circuit INV1 is connected with an input end of the inverter circuit INV2 through the thin film transistor Q5 controlled through the scanning line Y, and an output end of the second inverter circuit INV2 is connected with an input end of the first inverter circuit INV1. The thin film transistor Q5 does not enter a conductive state in a frame period in which it is turned on by rising of the scanning signal from the scanning line Y, but enters the conductive state in a frame period following this frame. As a result, the thin film transistor Q5 is maintained in a non-conductive state at least until the pixel switching element 111 fetches the video signal Vpix.

The thin film transistors Q6 and Q7 are respectively controlled by polarity control signals POL1 and POL2 which are alternately set at the high level in accordance with, e.g., each frame in the still picture display mode. The thin film transistor Q6 is connected between the pixel electrode PE and the input end of the second inverter circuit INV2, and the output end of the first inverter circuit INV1 through the thin film transistor Q5. The thin film transistor Q7 is connected between the pixel electrode pE and the input end of the inverter circuit INV1, and the output end of the inverter circuit INV2.

This liquid crystal display apparatus is of a drive circuit integrated type in which the liquid crystal controller 102, the scanning line drive circuit 103, the signal line drive circuit 104, the static memory portion 13 and the connection control portion 114 are arranged on the same array substrate AR as the pixel switching element 111. Here, the scanning line drive circuit 103, the signal line drive circuit 104, the static memory portion 113 and the connection control portion 114 can be formed together in such a process as described in conjunction with the foregoing embodiment. Therefore, the productivity can be improved with the performance of the liquid crystal display apparatus. Moreover, since each static memory portions 113 is provided, the function to hold the video signal supplied to the display pixel px can be obtained. In the still picture display mode, since the video signal is supplied from the static memory portion 113 to the display pixel PX, a power consumption of the entire display apparatus can be reduced by suspending the scanning line drive circuit 103 and the signal line drive circuit 104 in this state.

Although the description has been given as to the example in which the present invention is applied to the liquid crystal display apparatus which is an example of the display apparatus in the foregoing embodiment, any other planar display such as an EL display apparatus may be used.

As described above, according to the present invention, it is possible to obtain a crystallized semiconductor thin film or layer in which a particle size is large, crystallized grain formation positions are arranged in good order and crystal plane orientations are aligned. This technique enables the high-performance circuit configuration.

What is claimed is:

1. A method for forming a crystallized semiconductor layer comprising:
    preparing a non-single-crystal semiconductor layer in which at least one crystal seed is formed; and
    irradiating with an energy ray the non-single-crystal semiconductor layer having the crystal seed formed therein to allow a crystal to laterally grow from the crystal seed in the non-single-crystal semiconductor layer,
    wherein irradiation of the energy ray is carried out by positioning to at least a part of the crystal seed an area having a minimum intensity value of the energy ray, the energy ray having a conformation such that an area having a maximum intensity value of the energy ray is continuously reduced to the area having the minimum intensity value in an irradiated surface.

2. The method for forming a crystallized semiconductor layer according to claim 1, wherein the minimum intensity value of the energy ray has an irradiation intensity by which the crystal seed is not melted.

3. The method for forming a crystallized semiconductor layer according to claim 1, wherein the maximum intensity value of the energy ray is an intensity by which the non-single-crystal semiconductor layer is melted.

4. The method for forming a crystallized semiconductor layer according to claim 1, wherein the non-single-crystal semiconductor layer is an amorphous semiconductor layer or a polycrystalline semiconductor layer.

5. The method for forming a crystallized semiconductor layer according to claim 1, wherein the energy ray is an excimer laser beam.

6. The method for forming a crystallized semiconductor layer according to claim 5, wherein the excimer laser beam is a pulse laser beam.

7. The method for forming a crystallized semiconductor layer according to claim 1, wherein the crystal seed is formed by scanning the non-single-crystal semiconductor layer by using an energy ray.

8. The method for forming a crystallized semiconductor layer according to claim 1, wherein the at least one crystal seed is a plurality of dotted crystal seeds which are separated from each other along the non-single-crystal semiconductor layer or at least one filiform crystal seed.

9. The method for forming a crystallized semiconductor layer according to claim 1, wherein the energy ray is applied by an opto-spatial modulation element as an energy ray that an area in which the energy ray has a maximum intensity value is continuously reduced to an area in which the intensity has the minimum value.

10. The method for forming a crystallized semiconductor layer according to claim 9, wherein the opto-spatial modulation element has a phase shifter.

11. The method for forming a crystallized semiconductor layer according to claim 10, wherein the phase shifter has a transparent body including at least one thick part and a thin part crystal seed which are adjacent to each other.

12. The method for forming a crystallized semiconductor layer according to claim 11, further including a semi-permeable portion which is provided to each of the thick part and the thin part and has a transparent portion.

13. The method for forming a crystallized semiconductor layer according to claim 10, wherein the phase shifter has a transparent body including at least one thick part, a thin part crystal seed, and a phase shift portion formed of a step portion between the thick wall portion and the thin wall portion, and transmittance restricting means for an energy ray is provided on at least one surface of the transparent body.

14. The method for forming a crystallized semiconductor layer according to claim 13, wherein the transmittance restricting means is provided to each of the thick part and the thin wall portion of the transparent body, but it is not provided to the phase shift portion.

15. The method for forming a crystallized semiconductor layer according to claim 13, wherein the transmittance restricting means for an energy ray is provided to the thick part and the thin part crystal seed including the phase shift portion.

16. The method for forming a crystallized semiconductor layer according to claim 13, wherein the non-single-crystal semiconductor layer is formed of non-single-crystal silicon, and an intensity of the energy ray transmitted through the transmittance restricting means is lower than an energy ray intensity which is transmitted through the phase shift portion and required to crystallize the non-single-crystal silicon.

17. The method for forming a crystallized semiconductor layer according to claim 13, wherein there are carried out first crystallization processing in which an energy ray intensity transmitted through the part of the phase shifter to which the transmittance restricting means is not formed is higher than the energy required to crystallize non-single-crystal silicon, and second crystallization processing in which a minimum intensity through the phase shift portion is lower than an intensity to melt crystallized silicon and higher than an intensity to melt non-single-crystal silicon.

18. The method for forming a crystallized semiconductor layer according to claim 1, wherein preparing the non-single-crystal semiconductor layer comprises:
   a step of forming a crystallized semiconductor layer on an insulating substrate:
   a step of forming a non-single-crystal semiconductor layer on the crystallized semiconductor layer and the insulating substrate; and
   a step of eliminating an upper portion of the non-single-crystal semiconductor layer on the crystallized semiconductor,
   wherein the crystallized semiconductor layer becomes the crystal seed.

19. The method for forming a crystallized semiconductor layer according to claim 1, wherein preparing the non-single-crystal semiconductor layer comprises:
   a step of forming a non-single-crystal semiconductor layer on an insulating substrate; and
   a step of forming a crystal seed in the non-single-crystal semiconductor layer by irradiating with an energy way a part of the non-single-crystal semiconductor layer.

20. A method for forming a crystallized semiconductor layer comprising:
   forming a non-single-crystal semiconductor layer on a substrate;
   forming at least one crystal seed in the non-single-crystal semiconductor layer by irradiating the non-single-crystal semiconductor layer with an energy ray such that an area in which an irradiation intensity of the energy ray has a maximum value is continuously reduced to an area in which it has a minimum value in an irradiated surface; and
   allowing a crystal grain to laterally grow from the crystal seed in the non-single-crystal semiconductor layer by relatively moving the substrate with respect to the irradiating energy ray, positioning the area in which the energy ray irradiation intensity has the minimum value to the crystal seed, and applying the energy ray, the irradiation intensity of the energy ray having a maximum value continuously reduced to the area in which it has a minimum value in an irradiated surface.

21. A method for manufacturing a semiconductor device comprising:
   preparing a non-single-crystal semiconductor layer in which at least one crystal seed is formed;
   allowing a crystallized crystal growth area to laterally grow in the non-single-crystal semiconductor layer from the crystal seed by irradiating to the non-single-crystal semiconductor layer having the crystal seed formed therein, with an energy ray such that an area in which an irradiation intensity of the energy ray has a maximum value is continuously reduced to an area in which it has a minimum value in an irradiated area while positioning the area in which the irradiation intensity has the minimum value to the crystal seed; and
   forming in the crystal growth area at least one channel portion through which carriers of the semiconductor device move.

22. A method for manufacturing a semiconductor device comprising:
   preparing a non-single-crystal semiconductor layer in which at least one crystal seed is formed;
   allowing a crystallized crystal growth area to laterally grow in the non-single-crystal semiconductor layer from the crystal seed by irradiating the non-single-crystal semiconductor layer having the crystal seed formed therein, with an energy ray such that an area in which an irradiation intensity of the energy ray has a maximum value is continuously reduced to an area in which it has a minimum value in an irradiated area while positioning the area in which the irradiation intensity has the minimum value to the crystal seed; and
   forming an n-channel portion and a p-channel portion of a CMOS transistor in the crystal growth area.

23. A method for manufacturing a display apparatus having a control circuit which performs a display control over a display portion, comprising:
   forming a non-single-crystal semiconductor layer in at least the control circuit formation area on a substrate;
   forming at least one crystal seed in the non-single-crystal semiconductor layer;
   crystallizing the non-single-crystal semiconductor layer by irradiating with an energy ray having a conformation such that an area in which an irradiation intensity of the energy ray has a maximum value is continuously reduced to an area in which the irradiation intensity has a minimum value while positioning the area in which the irradiation intensity has the minimum value to the crystal seed; and
   forming a control circuit in such a manner that at least a channel area is formed in a crystallized area.

* * * * *